United States Patent
Moen

(10) Patent No.: US 12,519,010 B2
(45) Date of Patent: Jan. 6, 2026

(54) SOI STRUCTURES WITH CARBON IN BODY REGIONS FOR IMPROVED RF-SOI SWITCHES

(71) Applicant: Newport Fab, LLC, Newport Beach, CA (US)

(72) Inventor: Kurt Moen, Tustin, CA (US)

(73) Assignee: Newport Fab, LLC, Newport Beach, CA (US)

( * ) Notice: Subject to any disclaimer, the term of this patent is extended or adjusted under 35 U.S.C. 154(b) by 802 days.

(21) Appl. No.: 17/847,006

(22) Filed: Jun. 22, 2022

(65) Prior Publication Data

US 2023/0360962 A1     Nov. 9, 2023

Related U.S. Application Data

(63) Continuation-in-part of application No. 17/735,450, filed on May 3, 2022, now abandoned.

(51) Int. Cl.
| | | |
|---|---|---|
| *H10D 86/01* | (2025.01) | |
| *H01L 21/02* | (2006.01) | |
| *H01L 21/20* | (2006.01) | |
| *H01L 21/762* | (2006.01) | |
| *H10D 86/00* | (2025.01) | |

(52) U.S. Cl.
CPC .. *H01L 21/76243* (2013.01); *H01L 21/02115* (2013.01); *H01L 21/2007* (2013.01); *H10D 86/01* (2025.01); *H10D 86/201* (2025.01)

(58) Field of Classification Search
CPC ......... H01L 21/76243; H01L 21/02115; H01L 21/2007; H10D 86/01; H10D 86/201
See application file for complete search history.

(56) References Cited

U.S. PATENT DOCUMENTS

| | | | | |
|---|---|---|---|---|
| 6,635,950 B1 * | 10/2003 | Ishida | ................. | H10D 62/834 |
| | | | | 257/E29.086 |
| 9,484,417 B1 * | 11/2016 | Wu | ...................... | H10D 84/038 |
| 9,899,475 B2 * | 2/2018 | Yu | ....................... | H10D 84/0133 |
| 2002/0187612 A1 * | 12/2002 | Sleight | ................. | H10D 86/201 |
| | | | | 257/E21.415 |
| 2008/0164491 A1 * | 7/2008 | Liu | ...................... | H10D 84/017 |
| | | | | 257/190 |
| 2013/0273699 A1 * | 10/2013 | Chidambarrao | ... | H10D 30/0278 |
| | | | | 438/153 |

(Continued)

*Primary Examiner* — Eugene Lee
(74) *Attorney, Agent, or Firm* — Farjami & Farjami LLP

(57) ABSTRACT

A semiconductor-on-insulator (SOI) structure includes a semiconductor layer over a buried oxide over a handle wafer. A carbon-doped epitaxial layer is in the semiconductor layer. A doped body region is in the semiconductor layer under the carbon-doped epitaxial layer and extending to the buried oxide. The carbon-doped epitaxial layer and the doped body region have a same conductivity type. Alternatively, a doped body region in the semiconductor layer and extending to the buried oxide includes carbon dopants and body dopants, wherein a peak carbon dopant concentration is situated at a first depth, and a peak body dopant concentration is situated at a second depth below the first depth. Alternatively, an SOI transistor in the semiconductor layer includes a halo region having a different conductivity type from a source and a drain. The halo region includes carbon dopants and body dopants. The source and/or the drain adjoin the halo region.

12 Claims, 15 Drawing Sheets

(56) References Cited

U.S. PATENT DOCUMENTS

| | | | |
|---|---|---|---|
| 2014/0252504 A1* | 9/2014 | Chuang | H01L 21/76 438/294 |
| 2014/0264386 A1* | 9/2014 | Hoentschel | H10D 84/0167 257/77 |
| 2015/0200296 A1* | 7/2015 | Yu | H01L 21/30604 438/301 |
| 2016/0181311 A1* | 6/2016 | Kadono | H01L 21/02381 438/57 |
| 2016/0260841 A1* | 9/2016 | Yang | H10D 30/60 |
| 2017/0125556 A1* | 5/2017 | Gossner | H10D 30/6757 |
| 2020/0066867 A1* | 2/2020 | Cheng | H01L 21/76251 |
| 2020/0287019 A1* | 9/2020 | Mulfinger | H10D 64/018 |

* cited by examiner

SOI STRUCTURES WITH CARBON IN BODY REGIONS FOR IMPROVED RF-SOI SWITCHES

CLAIMS OF PRIORITY

The present application is a continuation-in-part of and claims the benefit of and priority to application Ser. No. 17/735,450 filed on May 3, 2022, titled "SOI Structures Including an Indium Retrograde P-Well for Improved RF-SOI Switches." The entire content of the above-identified application is hereby incorporated fully by reference into the present application.

BACKGROUND

Radio frequency (RF) switches are commonly utilized in wireless communication devices (e.g., smart phones) to route signals through transmit and receive paths, for example between the device's processing circuitry and the device's antenna. RF transistors, such as field effect transistor (FET) type RF transistors, can be arranged in a stack in order to improve RF power handling of RF switches. RF transistors can also be formed in semiconductor-on-insulator (SOI) substrates in order to provide insulation and reduce RF noise.

However, SOI substrates can be a source of other effects which degrade RF performance, such as punch-through effects, particularly when RF-SOI transistors are scaled down to have short channels. The product of ON-state resistance and OFF-state capacitance ($R_{ON} \times C_{OFF}$) is a figure of merit RF-SOI transistor designs strive to minimize in order to improve RF performance. During fabrication of SOI devices, especially during thermal processing, body dopants in a semiconductor layer can diffuse, thereby undermining conventional techniques for reducing the product $R_{ON} \times C_{OFF}$. Accordingly, fabricating RF-SOI transistors without significant RF performance tradeoffs, such as reduced breakdown voltage ($V_{BD}$) and reduced RF power handling, becomes difficult and complex.

Thus, there is a need in the art for RF-SOI transistors that have improved performance parameters with fewer tradeoffs.

SUMMARY

The present disclosure is directed to SOI structures with carbon in body regions for improved RF-SOI switches, substantially as shown in and/or described in connection with at least one of the figures, and as set forth in the claims.

DETAILED DESCRIPTION

Figure 1:
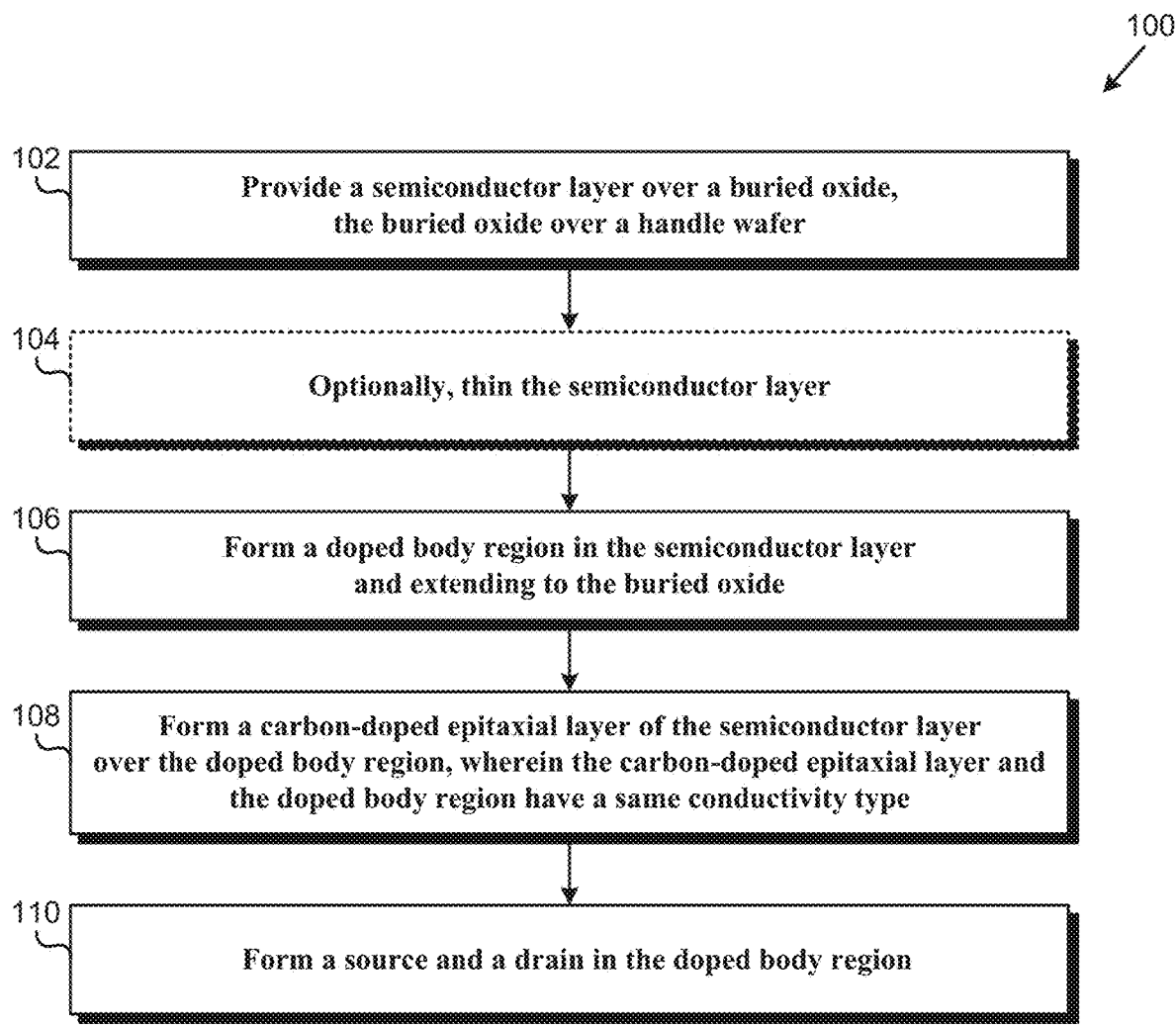
FIG. 1 illustrates a flowchart of an exemplary method for fabricating a semiconductor-on-insulator (SOI) structure according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 2:
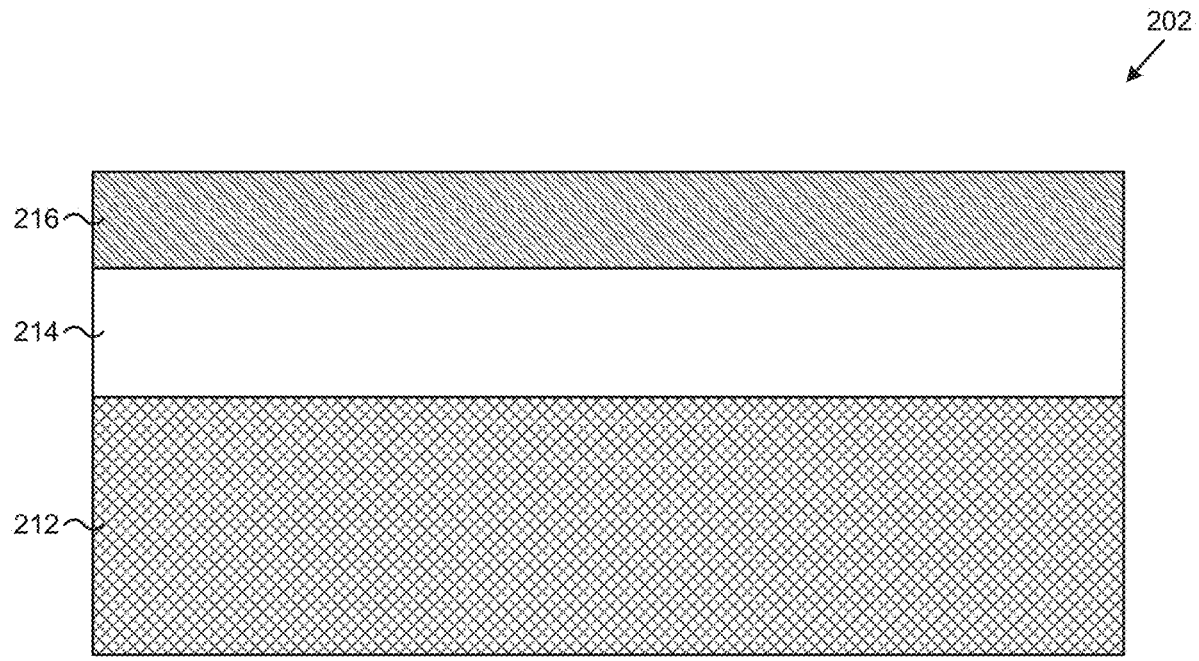
FIG. 2 illustrates an SOI structure processed in accordance with the flowchart of FIG. 1 according to one implementation of the present application.
Figure 3:
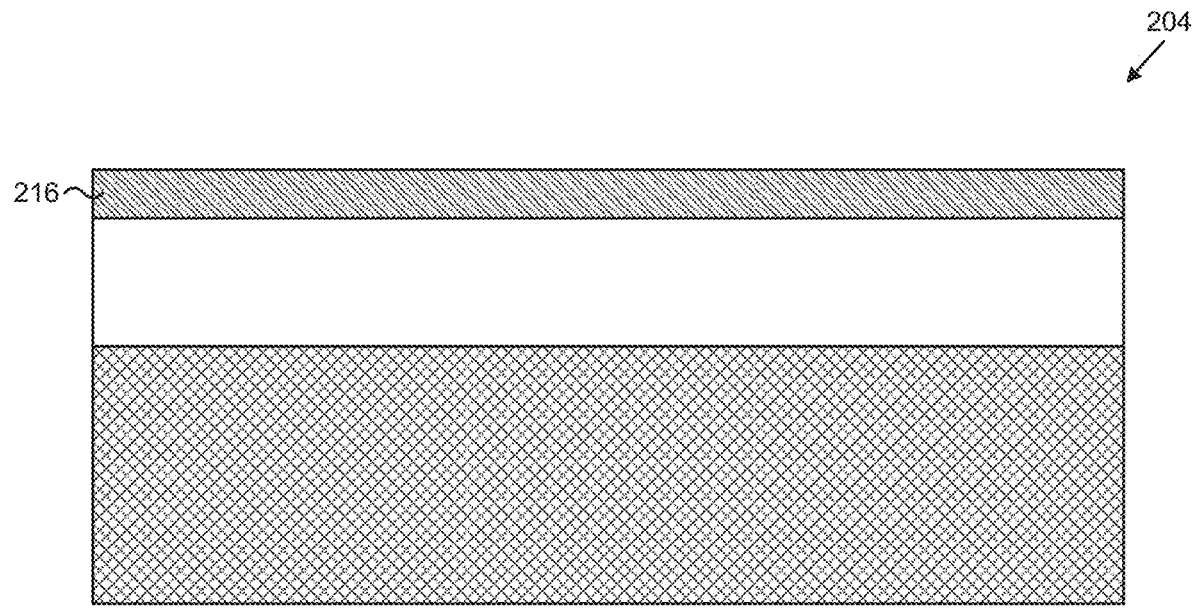
FIG. 3 illustrates an SOI structure processed in accordance with the flowchart of FIG. 1 according to one implementation of the present application.

FIG. 1 illustrates a flowchart of an exemplary method for manufacturing a semiconductor-on-insulator (SOI) structure according to one implementation of the present application. Structures shown in FIGS. 2 through 5 and 7 illustrate the results of performing actions 102 through 110 shown in flowchart 100 of FIG. 1. For example, FIG. 2 shows an SOI structure after performing action 102 in FIG. 1, FIG. 3 shows an SOI structure after performing action 104 in FIG. 1, and so forth.

Actions 102 through 110 shown in flowchart 100 of FIG. 1 are sufficient to describe one implementation of the present inventive concepts. Other implementations of the present inventive concepts may utilize actions different from those shown in the flowchart of FIG. 1. Certain details and features have been left out of the flowchart that are apparent to a person of ordinary skill in the art. For example, an action may consist of one or more sub-actions or may involve specialized equipment or materials, as known in the art. Moreover, some actions, such as masking and cleaning actions, are omitted so as not to distract from the illustrated actions.

FIG. 2 illustrates an SOI structure processed in accordance with action 102 in the flowchart of FIG. 1 according to one implementation of the present application. As shown in FIG. 2, SOI structure 202 is provided. SOI structure 202 is an SOI substrate including handle wafer 212, buried oxide (BOX) 214, and semiconductor layer 216.

In providing SOI structure 202, a bonded and etch back SOI (BESOI) process can be used, as known in the art. In a BESOI process, handle wafer 212, BOX 214, and semiconductor layer 216 together form an SOI substrate. Alternatively, as also known in the art, a SIMOX process (separation by implantation of oxygen process) or a "smart cut" process can also be used for providing SOI structure 202. In a SIMOX process, handle wafer 212 can be a bulk silicon support wafer (which for ease of reference, may still be referred to as a "handle wafer" in the present application). Similar to a BESOI process, in both SIMOX and smart cut processes, handle wafer 212, BOX 214, and semiconductor layer 216 together form an SOI substrate.

In one implementation, handle wafer 212 is undoped bulk silicon. In various implementations, handle wafer 212 can comprise germanium, group III-V material, or any other suitable handle material. In various implementations, handle wafer 212 has a thickness of approximately seven hundred microns (700 µm) or greater or less. In one implementation, a trap rich layer can be situated between handle wafer 212 and BOX 214. In various implementations, BOX 214 typically comprises silicon dioxide ($SiO_2$), but it may also comprise silicon nitride ($Si_xN_y$), or another insulator material. In various implementations, BOX 214 has a thickness of approximately one micron (1 µm) or greater or less. In one implementation, semiconductor layer 216 includes monocrystalline silicon. In various implementations, semiconductor layer 216 can comprise germanium, group III-V material, or any other semiconductor material. In various implementations, semiconductor layer 216 has a thickness of approximately three hundred nanometers (300 nm) or greater or less. Handle wafer 212, BOX 214, and semiconductor layer 216 can be provided together in SOI structure 202 as a pre-fabricated SOI substrate.

FIG. 3 illustrates an SOI structure processed in accordance with action 104 in the flowchart of FIG. 1 according to one implementation of the present application. As shown in FIG. 3, in SOI structure 204, semiconductor layer 216 is thinned.

Semiconductor layer 216 can be thinned using any means known in the art. In one implementation, semiconductor layer 216 can be thinned by oxidizing a portion of semiconductor layer 216 followed by a wet etching the oxidized portion, for example, using diluted hydrofluoric acid (DHF). In another implementation, semiconductor layer 216 can be thinned by grinding and/or chemical mechanical polishing (CMP). In various implementations, semiconductor layer 216 may be thinned to approximately half its original thickness, or greater or less.

Figure 4:
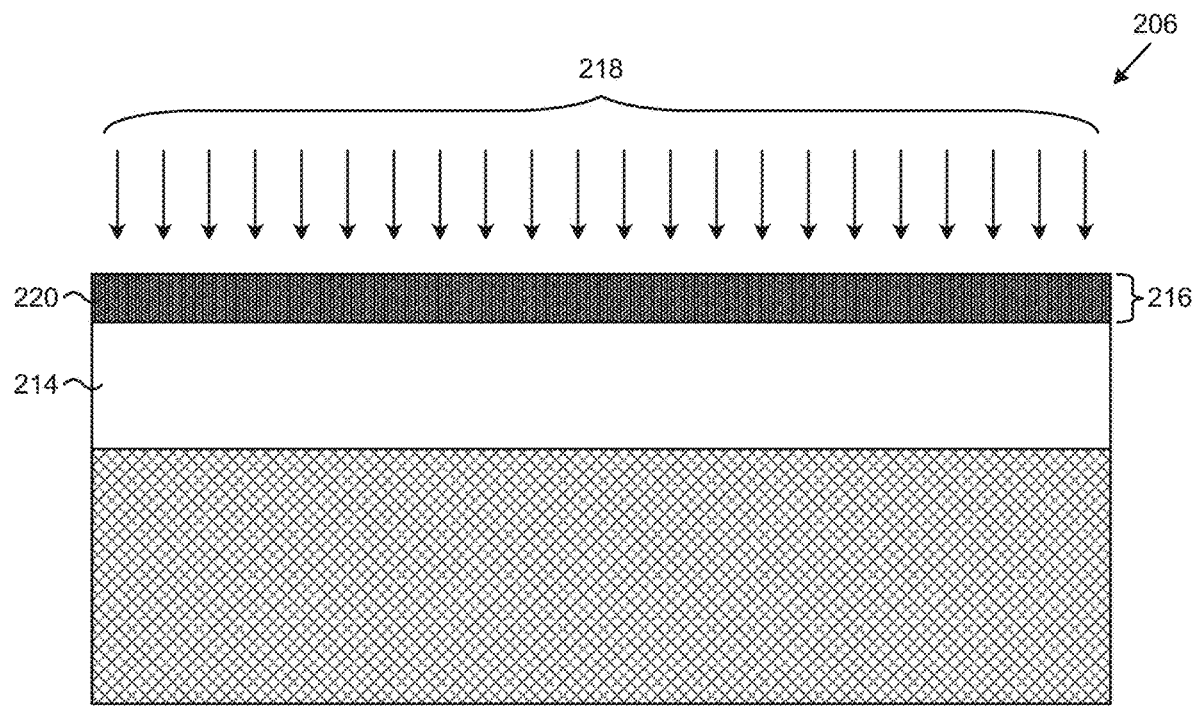
FIG. 4 illustrates an SOI structure processed in accordance with the flowchart of FIG. 1 according to one implementation of the present application.

FIG. 4 illustrates an SOI structure processed in accordance with action 106 in the flowchart of FIG. 1 according to one implementation of the present application. As shown in FIG. 4, in SOI structure 206, doped body region 220 is formed in semiconductor layer 216 and extending to BOX 214.

Doped body region 220 is a region in semiconductor layer 216 comprising body dopants 218 and having a first conductivity type. In one implementation, doped body region 220 may consist of boron body dopants and have P-type conductivity. In another implementation, doped body region 220 may comprise a mixture of other P-type body dopants. In one implementation, doped body region 220 may be formed by ion implantation of body dopants 218 through a top surface of semiconductor layer 216. In one implementation, body dopants 218 may comprise boron difluoride ($BF_2$) utilizing an implantation energy of approximately fifteen kiloelectronvolts (15 keV). In another implementation, body dopants 218 may comprise boron (B) utilizing an implantation energy of approximately two to six kiloelectron-volts (2-6 keV). In one implementation body dopants 218 may have an implant dosage of approximately $4.0*10^{12}/cm^3$ or greater or less. In one implementation, the ion implantation may be followed by rapid thermal processing (RTP) to heal implant damage and suppress transient enhanced diffusion (TED).

Notably, as shown in FIG. 4, doped body region 220 is formed such that it extends to BOX 214. That is, doped body region 220 is at the interface of semiconductor layer 216 with BOX 214. In the implementation shown in FIG. 4, doped body region 220 is formed along the entire width of SOI structure 206, which may simplify fabrication. In various implementations, doped body region 220 may be formed in select regions along the width of SOI structure 206, for example, by using a mask prior ion implantation. It is also noted that SOI structure 206 in FIG. 4 may be achieved by different fabrication actions and/or by different ordering of actions than those specifically described above. For example, a similar structure to SOI structure 206 may be achieved by implanting body dopants 218 in semiconductor layer 216 prior to thinning semiconductor layer 216, that is, by switching actions 104 and 106 in the flowchart of FIG. 1.

Figure 5:
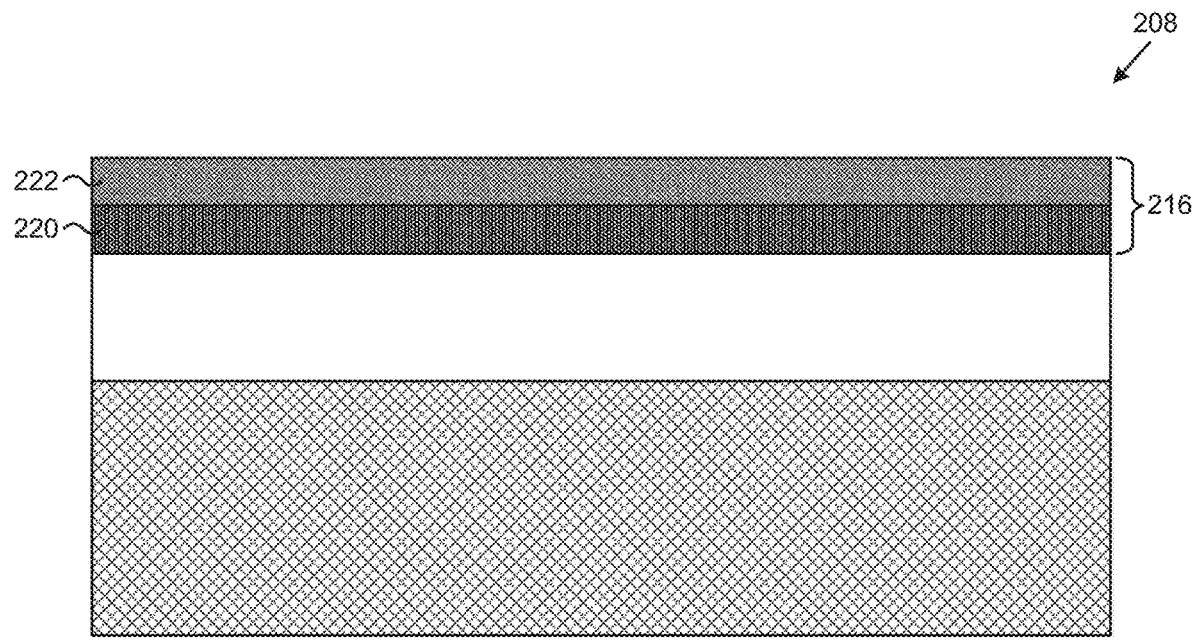
FIG. 5 illustrates an SOI structure processed in accordance with the flowchart of FIG. 1 according to one implementation of the present application.

FIG. 5 illustrates an SOI structure processed in accordance with action 108 in the flowchart of FIG. 1 according to one implementation of the present application. As shown in FIG. 5, in SOI structure 208, carbon-doped epitaxial layer 222 of semiconductor layer 216 is formed over doped body region 220.

Carbon-doped epitaxial layer 222 is an epitaxial layer of semiconductor layer 216 comprising both carbon dopants and body dopants having the first conductivity type. Continuing the above examples where semiconductor layer 216 includes monocrystalline silicon and doped body region 220 consists of P-type body dopants, carbon-doped epitaxial layer 222 may be epitaxial monocrystalline silicon having both carbon dopants and P-type body dopants. Carbon-doped epitaxial layer 222 has doped body region 220 thereunder. Carbon-doped epitaxial layer 222 and doped body region 220 have the same conductivity type. In one implementation, carbon-doped epitaxial layer 222 may have a lower concentration of body dopants compared to doped body region 220.

Carbon-doped epitaxial layer 222 may be formed using any suitable techniques known in the art. In one implementation, carbon-doped epitaxial layer 222 of semiconductor layer 216 is formed over doped body region 220, for example, using a low deposition-rate selective epitaxial growth (SEG). The dopants of carbon-doped epitaxial layer 222 may be introduced in situ while carbon-doped epitaxial layer 222 is formed. For example, carbon dopants may be introduced by flowing methylsilane at approximately one to fifty standard cubic centimeters per minute (1-50 SCCM), and body dopants may be introduced using chemical vapor deposition (CVD). In various implementations, carbon-doped epitaxial layer 222 may also be epitaxially grown using one of molecular beam epitaxy (MBE), atomic layer deposition (ALD), or low energy plasma-enhanced chemical vapor deposition (LEPECVD), and may be doped using one of diffusion or ion implantation. In various implementation, carbon-doped epitaxial layer 222 may have a thickness approximately equal to the thickness of semiconductor layer 216 that was removed during the thinning action 104 in the flowchart of FIG. 1, such that semiconductor layer 216 in SOI structure 208 in FIG. 5 has approximately the same thickness as semiconductor layer 216 initially provided in SOI structure 202 in FIG. 2.

Figure 6:
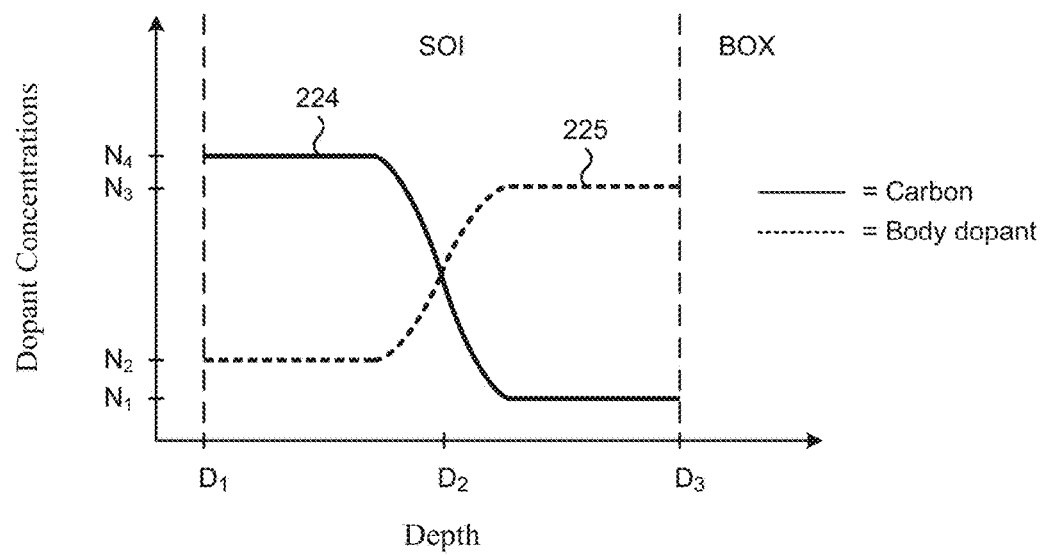
FIG. 6 illustrates an exemplary graph of dopant concentrations versus depth according to one implementation of the present application.

FIG. 6 illustrates an exemplary graph of dopant concentrations versus depth according to one implementation of the present application. In the graph, the y-axis represents the concentration of dopants in semiconductor layer 216 in FIG. 5. The x-axis represents the depth in semiconductor layer 216 in FIG. 5, where depth $D_1$ corresponds to a top surface of semiconductor layer 216, depth $D_2$ corresponds to the bottom of carbon-doped epitaxial layer 222, and depth $D_3$ corresponds to a bottom surface of semiconductor layer 216. Trace 224 represents the concentration of carbon dopants in semiconductor layer 216. Trace 225 represents the concentration of body dopants having the first conductivity type, such as boron dopants, in semiconductor layer 216.

As shown by trace 224 in FIG. 6, carbon dopants have a higher dopant concentration $N_4$ occurring from depth $D_1$ to approximately depth $D_2$, which generally corresponds to carbon-doped epitaxial layer 222. From approximately depth $D_2$ to depth $D_3$, the dopant concentration of the carbon dopants falls significantly to lower dopant concentration $N_1$, which generally corresponds to doped body region 220. Concentration $N_1$ may represent a negligible or substantially zero carbon concentration. As shown by trace 225, body dopants have a lower dopant concentration $N_2$ occurring from depth $D_1$ to approximately depth $D_2$, which generally corresponds to carbon-doped epitaxial layer 222. From approximately depth $D_2$ to depth $D_3$, the dopant concentration of the body dopants rises significantly to higher concentration $N_3$, which generally corresponds to doped body region 220.

As shown by traces 224 and 225 in FIG. 6, forming carbon-doped epitaxial layer 222 of semiconductor layer 216 over doped body region 220, as shown in FIG. 5 and in accordance with action 108 in the flowchart of FIG. 1, allows sharp dopant concentration transitions in semiconductor layer 216 near the bottom of carbon-doped epitaxial layer 222 (i.e., near depth $D_2$). Carbon dopants can be effectively localized to carbon-doped epitaxial layer 222, with little or negligible carbon dopants thereunder. Also, semiconductor layer 216 can provide a retrograde doping profile with respect to body dopants having the first conductivity type. For example, a higher body dopant concentration can occur near the interface of semiconductor layer 216 with BOX 214 (i.e., between depths $D_2$ and $D_3$), while a lower body dopant concentration can occur in carbon-doped epitaxial layer 222 (i.e., between depths $D_1$ and $D_2$). In other implementations, the body dopant concentration between depths $D_1$ and $D_2$ may be higher than or similar to the body dopant concentration between depths $D_2$ and $D_3$. In various implementations, traces 224 and 225 may exhibit different patterns or slopes than shown in FIG. 6.

Figure 7:
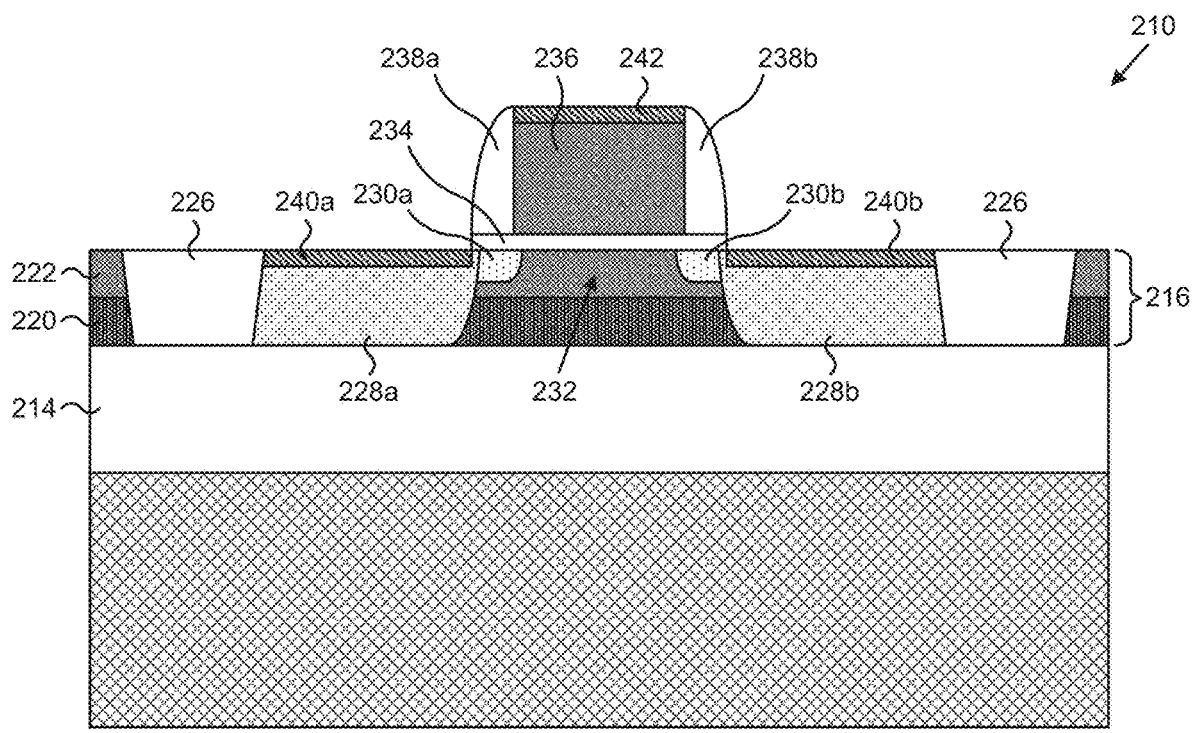
FIG. 7 illustrates an SOI structure processed in accordance with the flowchart of FIG. 1 according to one implementation of the present application.

FIG. 7 illustrates an SOI structure processed in accordance with action 110 in the flowchart of FIG. 1 according to one implementation of the present application. As shown in FIG. 7, in SOI structure 210, source 228a and drain 228b are formed in doped body region 220. As also shown in FIG. 7, in SOI structure 210, additional components are also formed, including shallow trench isolations (STIs) 226, lightly-doped source (LDS) 230a, lightly-doped drain (LDD) 230b, gate oxide 234, gate 236, dielectric spacers 238a and 238b, source/drain silicides 240a and 240b, and gate silicide 242. SOI structure 210 in FIG. 7 includes a substantially completed SOI transistor in semiconductor layer 216, and may also be referred to as SOI device 210 in the present application.

Shallow trench isolations (STIs) 226 are formed in doped body region 220. More specifically, STIs 226 are formed in semiconductor layer 216, extending through carbon-doped epitaxial layer 222 and into doped body region 220. STIs 226 may comprise, for example, silicon dioxide ($SiO_2$) or another dielectric. STIs 226 may be formed in a manner known in the art. In the present implementation, STIs 226 are shown as extending to BOX 214. In other implementations, STIs 226 may extend deeper or shallower in SOI structure 210. In the present implementation, STIs 226 are formed after doped body region 220, which helps ensure doped body region 220 extends uniformly to BOX 214. For example, if STIs 226 were formed before doped body region 220, STIs 226 could inhibit body dopants implanted through a top surface of semiconductor layer 216 from extending to BOX 214 in areas near the bottoms of STIs 226. In various implementations, SOI structure 210 may include more or fewer STIs 226 than shown in FIG. 7.

Source 228a and drain 228b are regions in semiconductor layer 216 having a second conductivity type opposite to the first conductivity type. Continuing the above examples where doped body region 220 and carbon-doped epitaxial layer 222 comprise P-type body dopants, source 228a and drain 228b may comprise N-type dopants, such as arsenic and/or phosphorus, for example, and may be formed in a manner known in the art. In SOI structure 210, source 228a and drain 228b are situated between STIs 226, in doped body region 220 and carbon-doped epitaxial layer 222. Doped body region 220 extending to BOX 214 is situated between lower portions of source 228a and drain 228b. In the present implementation, source 228a and drain 228b extend to BOX 214. In other implementations, source 228a and drain 228b may extend shallower in SOI structure 210.

LDS 230a and LDD 230b are regions in semiconductor layer 216 having the second conductivity type and having a lower dopant concentration than source 228a and drain 228b, and may be formed in a manner known in the art. As shown in FIG. 7, LDS 230a and LDD 230b are situated in carbon-doped epitaxial layer 222, and do not extend to doped body region 220. LDS 230a and LDD 230b are situated under dielectric spacers 238a and 238b and substantially aligned with sides of gate 236. As known in the art, source 238a and LDS 230a together function as a source of SOI device 210, while drain 238b and LDD 230b together function as a drain of SOI device 210. Channel region 232 of SOI device 210 is between source 228a and drain 228b, and more particularly, between LDS 230a and LDD 230b, in carbon-doped epitaxial layer 222.

Gate oxide 234 is situated on semiconductor layer 216 over LDS 230a, LDD 230b, and channel region 232. Gate oxide 234 can comprise, for example, silicon dioxide ($SiO_2$) or another dielectric. Gate 236 is situated over gate oxide 234. Gate 236 can comprise polycrystalline silicon (polysilicon) or a conductive metal. Dielectric spacers 238a and 238b are situated on sides of gate 236. Dielectric spacers 238a and 238b can comprise, for example, silicon nitride. In the present implementation, source 228a and drain 228b are substantially aligned with dielectric spacers 268.

Source silicide 240a, drain silicide 240b, and gate silicide 242 are situated on source 228a, drain 228b, and gate 236 respectively. Source silicide 240a, drain silicide 240b, and gate silicide 242 may be formed, for example, by sputtering a metal layer, such as a cobalt (Co) or nickel (Ni) layer, followed by performing a first thermal anneal (RTA) to cause the metal layer to react with source 228a, drain 228b, and gate 236 to form metal-rich source silicide 240a, drain silicide 240b, and gate silicide 242. As known in the art, source silicide 240a, drain silicide 240b, and gate silicide 242 create highly conductive electrical connections to source 228a, drain 228b, and gate 236 respectively, and reduce corresponding contact resistances of SOI device 210.

SOI device 210 in FIG. 7 represents a substantially completed device. However, SOI device 210 can also include fewer elements than shown in FIG. 7 and/or additional elements not shown in FIG. 7. For example, a multi-layer stack of metallizations and interlayer dielectrics can be situated over SOI device 210 to create connections to source silicide 240a, drain silicide 240b, and gate silicide 242. As another example, passive devices, such as inductors and capacitors, can be integrated in an overlying multi-layer stack. As yet another example, additional transistors (not shown in FIG. 7) can be situated in semiconductor layer 216.

In SOI device 210, carbon-doped epitaxial layer 222 of semiconductor layer 216 and doped body region 220 of semiconductor layer 216 have the same conductivity type and together function as a transistor body. Doped body region 220 is situated under carbon-doped epitaxial layer 222. Carbon-doped epitaxial layer 222 inhibits body dopants of doped body region 220, such as boron, from diffusing upwards during fabrication of SOI device 210 and during subsequent thermal processing, thereby maintaining a higher concentration of body dopants in doped body region 220 near the critical interface of semiconductor layer 216 with BOX 214. Notably, doped body region 220 extends to this interface, and source 238a and drain 238b are situated in doped body region 220. As a result, the higher concentration of body dopants in doped body region 220 advantageously inhibits short-channel effects that would otherwise occur at the interface of semiconductor layer 216 with BOX 214, such as punch-through of source 228a and drain 228b.

Also notably, SOI device 212 includes LDS 230a, LDD 230b, and channel region 232 in carbon-doped epitaxial layer 222. Where carbon-doped epitaxial layer 222 has a relatively low concentration of body dopants of the first conductivity type, channel region 232 experiences less current scattering and higher mobility when SOI device 210 is in an ON state. In other words, because of the retrograde doping profile between doped body region 220 and carbon-doped epitaxial layer 222, SOI device 210 benefits from a lower ON-state resistance ($R_{ON}$). As another result, there is less counter-doping in regions where LDS 230a and LDD 230b are formed, and LDS 230a and LDD 230b have higher concentrations of dopants of the second conductivity type, thereby further lowering $R_{ON}$. In a similar manner, there is less counter-doping in upper portions of source 228a and drain 232b, and siliciding metal may react with portions having higher concentrations of dopants of the second conductivity type in order to form higher quality source silicide 240a and drain silicide 240b, thereby further lowering $R_{ON}$.

Figure 8:
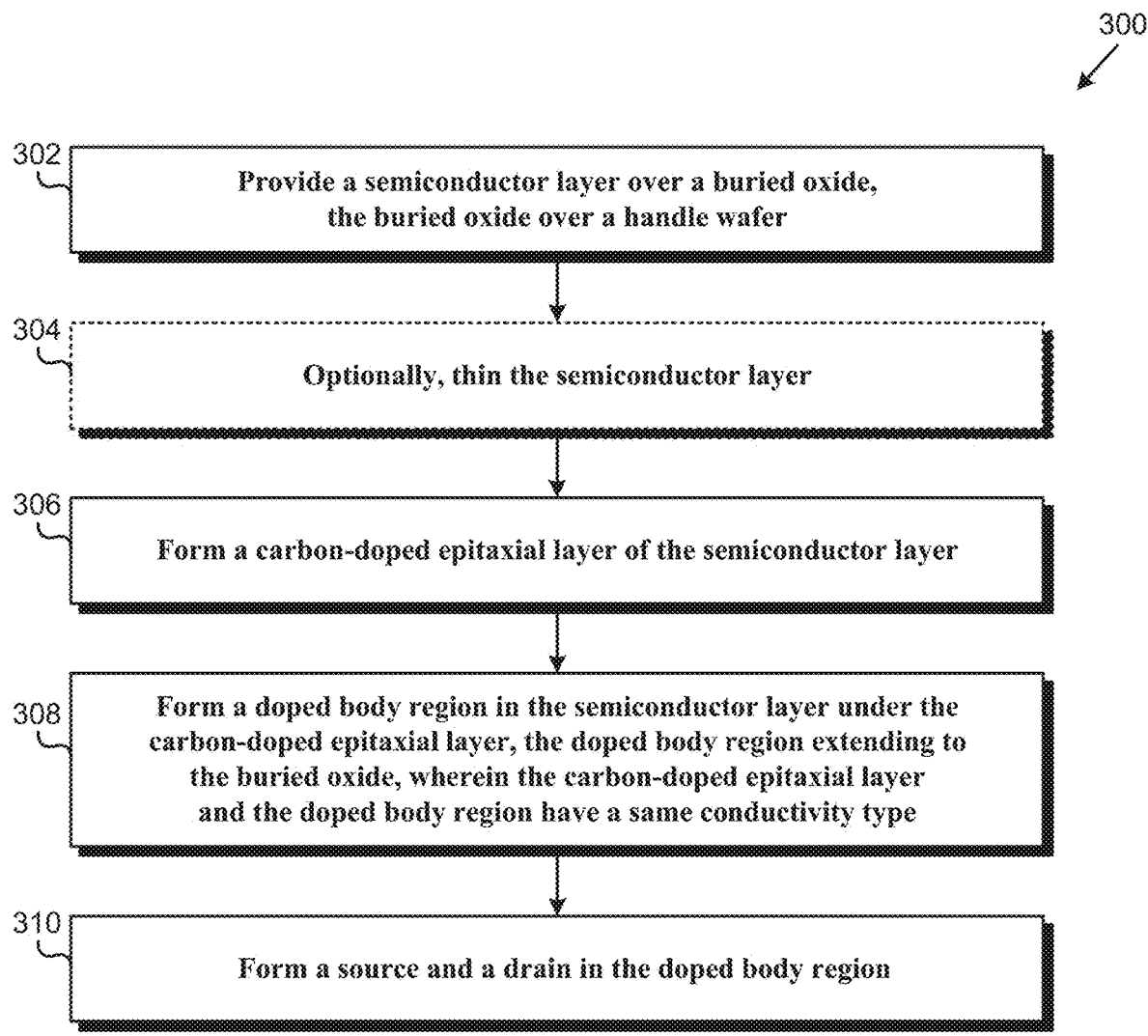
FIG. 8 illustrates a flowchart of an exemplary method for fabricating an SOI structure according to one implementation of the present application.
Figure 9:
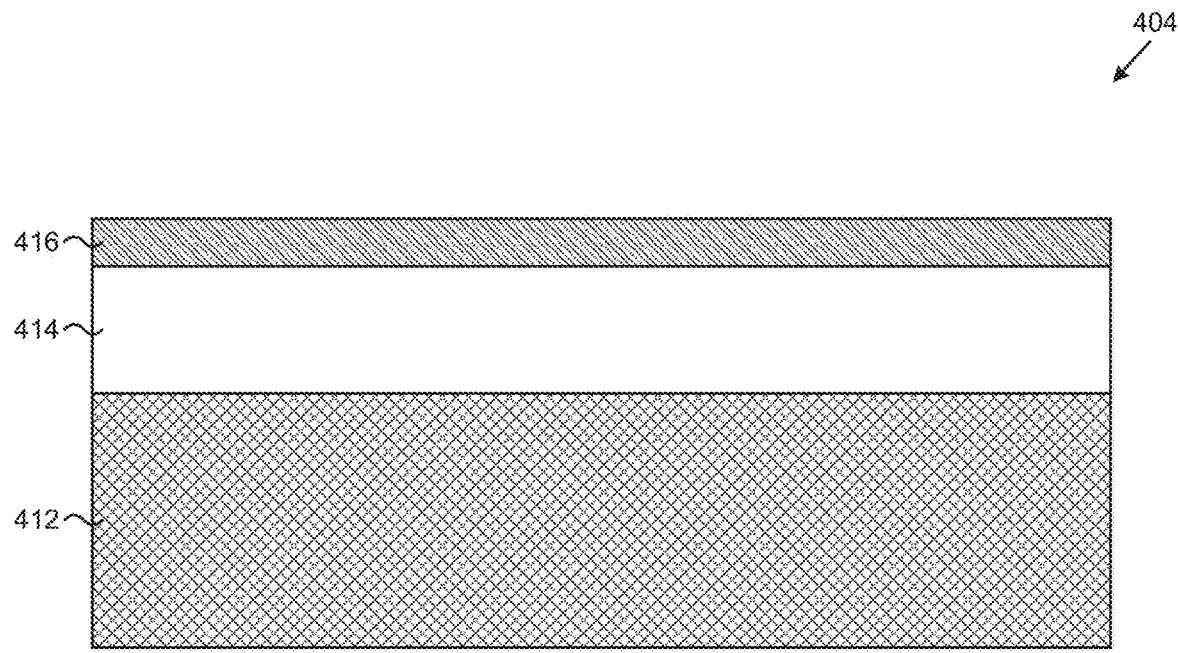
FIG. 9 illustrates an SOI structure processed in accordance with the flowchart of FIG. 8 according to one implementation of the present application.
Figure 10:
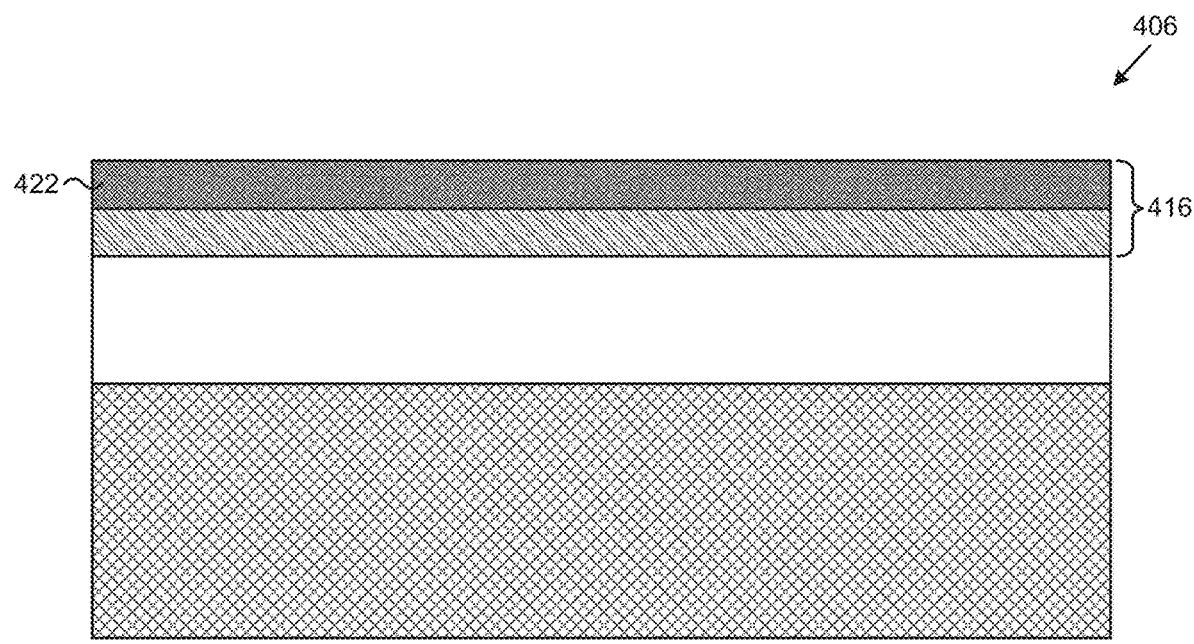
FIG. 10 illustrates an SOI structure processed in accordance with the flowchart of FIG. 8 according to one implementation of the present application.
Figure 11:
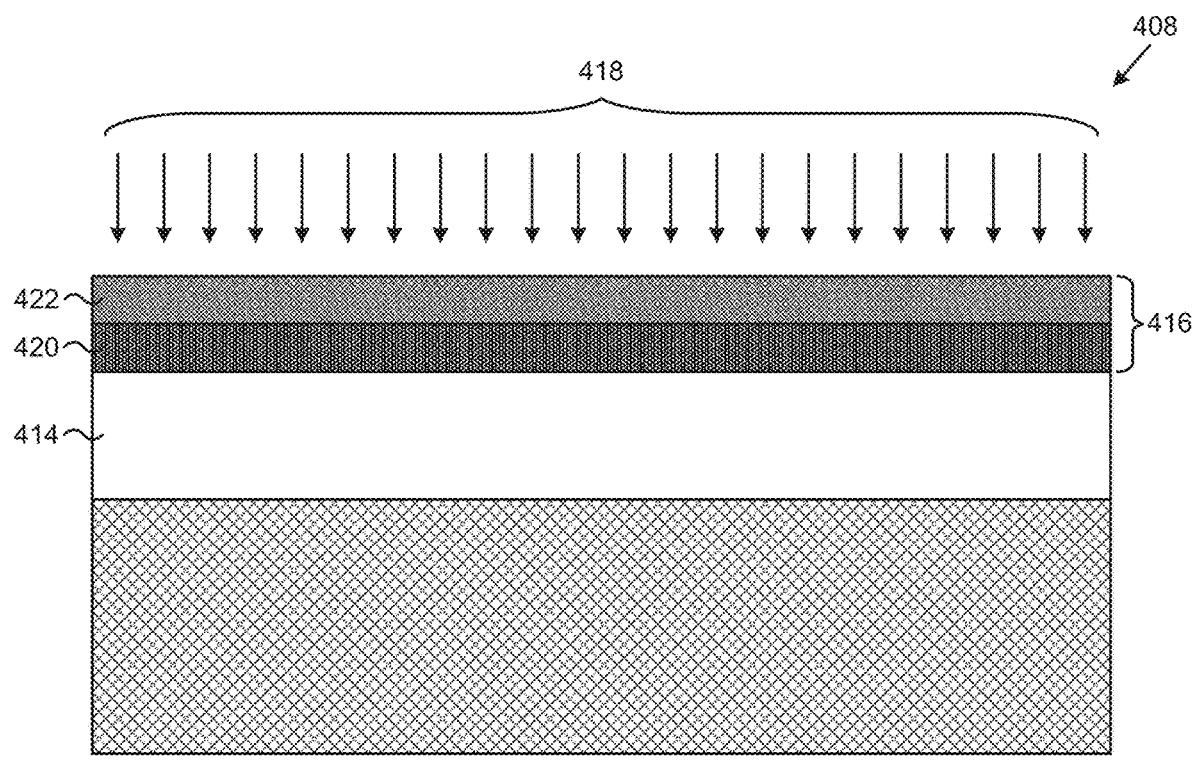
FIG. 11 illustrates an SOI structure processed in accordance with the flowchart of FIG. 8 according to one implementation of the present application.

FIG. 8 illustrates a flowchart of an exemplary method for fabricating an SOI structure according to one implementation of the present application. Structures shown in FIGS. 9 through 11 illustrate the results of performing actions 302 through 308 shown in flowchart 300 of FIG. 8. For example, FIG. 9 shows an SOI structure after performing actions 302 and 304 in FIG. 8, FIG. 10 shows an SOI structure after performing action 306 in FIG. 8, and so forth.

Actions 302 through 310 shown in flowchart 300 of FIG. 8 are sufficient to describe one implementation of the present inventive concepts. Other implementations of the present inventive concepts may utilize actions different from those shown in the flowchart of FIG. 8. Certain details and features have been left out of the flowchart that are apparent to a person of ordinary skill in the art. For example, an action may consist of one or more sub-actions or may involve specialized equipment or materials, as known in the art. Moreover, some actions, such as masking and cleaning actions, are omitted so as not to distract from the illustrated actions.

FIG. 9 illustrates an SOI structure processed in accordance with actions 302 and 304 in the flowchart of FIG. 8 according to one implementation of the present application. As shown in FIG. 9, SOI structure 404 including handle wafer 412, BOX 414, and semiconductor layer 416 has been provided, and semiconductor layer 416 has been thinned. SOI structure 404 in FIG. 8 generally corresponds to SOI structure 204 in FIG. 3, and may have any implementations and advantages described above.

FIG. 10 illustrates an SOI structure processed in accordance with action 306 in the flowchart of FIG. 8 according to one implementation of the present application. As shown in FIG. 10, in SOI structure 406, carbon-doped epitaxial layer 422 of semiconductor layer 416 is formed.

As described above, carbon-doped epitaxial layer 422 is an epitaxial layer of semiconductor layer 416 comprising both carbon dopants and body dopants having the first conductivity type. Referring back to FIG. 5, carbon-doped epitaxial layer 222 in FIG. 5 has doped body region 220 thereunder when carbon-doped epitaxial layer 222 is formed, whereas carbon-doped epitaxial layer 422 in FIG. 10 does not have such a doped body region thereunder when carbon-doped epitaxial layer 422 is formed. Otherwise, carbon-doped epitaxial layer 422 in FIG. 10 generally corresponds to carbon-doped epitaxial layer 222 in FIG. 5 and may have any implementations and advantages described above.

FIG. 11 illustrates an SOI structure processed in accordance with action 308 in the flowchart of FIG. 8 according to one implementation of the present application. As shown in FIG. 11, in SOI structure 408, doped body region 420 is formed in semiconductor layer 416 under carbon-doped epitaxial layer 422 and extending to BOX 414. Except for differences noted below, doped body region 420 in FIG. 11 generally corresponds to doped body region 220 in FIG. 4 and may have any implementations and advantages described above.

As described above, doped body region 420 is a region in semiconductor layer 416 comprising body dopants 418 and having a first conductivity type. Notably, doped body region 420 in FIG. 11 is formed through carbon-doped epitaxial layer 422. Accordingly, formation of doped body region 420 in FIG. 11 may utilize a higher implantation energy and implant dosage compared to formation of doped body region 220 in FIG. 4. In one implementation, body dopants 218 may comprise $BF_2$ having an implant dosage of approximately $5.0*10^{12}/cm^3$ to $4.0*10^{13}/cm^3$, and may utilize an implantation energy of approximately twenty five kiloelectronvolts (25 keV).

Figure 12:
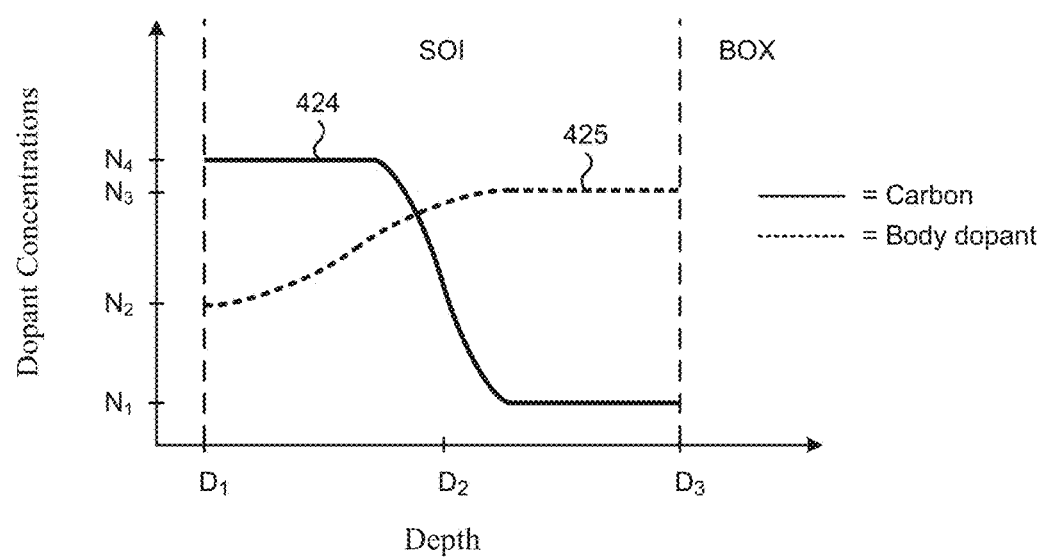
FIG. 12 illustrates an exemplary graph of dopant concentrations versus depth according to one implementation of the present application.

FIG. 12 illustrates an exemplary graph of dopant concentrations versus depth according to one implementation of the present application. In the graph, the y-axis represents the concentration of dopants in semiconductor layer 416 in FIG. 11. The x-axis represents the depth in semiconductor layer 416 in FIG. 11, where depth $D_1$ corresponds to a top surface of semiconductor layer 416, depth $D_2$ corresponds to the bottom of carbon-doped epitaxial layer 422, and depth $D_3$ corresponds to a bottom surface of semiconductor layer 416. Trace 424 represents the concentration of carbon dopants in semiconductor layer 416. Trace 425 represents the concentration of body dopants having the first conductivity type, such as boron dopants, in semiconductor layer 416.

As shown by trace 424 in FIG. 12, carbon dopants have a higher dopant concentration $N_4$ occurring from depth $D_1$ to approximately depth $D_2$, which generally corresponds to carbon-doped epitaxial layer 422. From approximately depth $D_2$ to depth $D_3$, the dopant concentration of the carbon dopants falls significantly to lower dopant concentration $N_1$, which generally corresponds to doped body region 420. Concentration $N_1$ may represent a negligible or substantially zero carbon concentration. As shown by trace 425, body dopants have a low dopant concentration $N_2$ occurring at depth $D_1$. From depth $D_1$ to approximately depth $D_2$, the dopant concentration of the body dopants rises gradually to higher dopant concentration $N_3$, which generally corresponds to carbon-doped epitaxial layer 422. From approximately depth $D_2$ to depth $D_3$, the dopant concentration of the body dopants remains at higher concentration $N_3$, which generally corresponds to doped body region 420.

As shown by traces 424 and 425 in FIG. 12, forming doped body region 420 in semiconductor layer 416 under carbon-doped epitaxial layer 422, as shown in FIG. 11 and in accordance with action 308 in the flowchart of FIG. 8, allows a sharp carbon dopant concentration transition in semiconductor layer 416 near the bottom of carbon-doped epitaxial layer 422 (i.e., near depth $D_2$), while body dopants having the first conductivity type can exhibit a more gradual dopant concentration transition in semiconductor layer 416 and still provide a retrograde doping profile. For example, comparing trace 425 in FIG. 12 to trace 225 in FIG. 6, trace 425 in FIG. 12 generally has higher body dopant concentration $N_2$ in carbon-doped epitaxial layer 422 (i.e., between depths $D_1$ and $D_2$), and generally has a more gradual transition to its peak body dopant concentration $N_3$ in doped body region 420 (i.e., between depths $D_2$ and $D_3$), due to body dopants 418 being formed through carbon-doped epitaxial layer 422.

In various implementations, traces 424 and 425 may exhibit different patterns or slopes than shown in FIG. 12. It is also noted that SOI structure 408 in FIG. 11 may be achieved by different fabrication actions and/or by different ordering of actions than those specifically described above. For example, a similar structure to SOI structure 408 may be achieved by replacing carbon-doped epitaxial layer 422 formed in FIG. 10 with an epitaxial layer having carbon dopants but devoid of body dopants, then implanting body dopants 418 as shown in FIG. 11. In such example, carbon-doped epitaxial layer 422 and doped body region 420 may be formed substantially concurrently when body dopants 418 are implanted into semiconductor layer 416.

Thus, SOI structure 408 in FIG. 11 manufactured according to the flowchart in FIG. 8 generally represents an alternative to SOI structure 208 in FIG. 5 manufactured according to the flowchart in FIG. 2. Both SOI structures 208 and 408 enable sharp transitions in carbon dopant concentrations. SOI structure 208 may more readily enable sharp transitions in body dopant concentration, while SOI structure 408 may more readily enable gradual transitions in body dopant concentration and simplified processing.

Processing of SOI structure 408 in FIG. 11 can continue with action 310 in the flowchart in FIG. 8 by forming a source and a drain in doped body region 420, and forming a transistor in semiconductor layer 416 in order to complete an SOI device. Except for differences noted above, the resulting SOI device may appear similar to SOI device 210 shown in FIG. 7, and may include the additional components shown therein. The resulting SOI device may also have any implementations and advantages described above. In particular, as described above, carbon-doped epitaxial layer 422 inhibits body dopants of doped body region 420, such as boron, from diffusing upwards during fabrication of the SOI device and during subsequent thermal processing.

Figure 13:
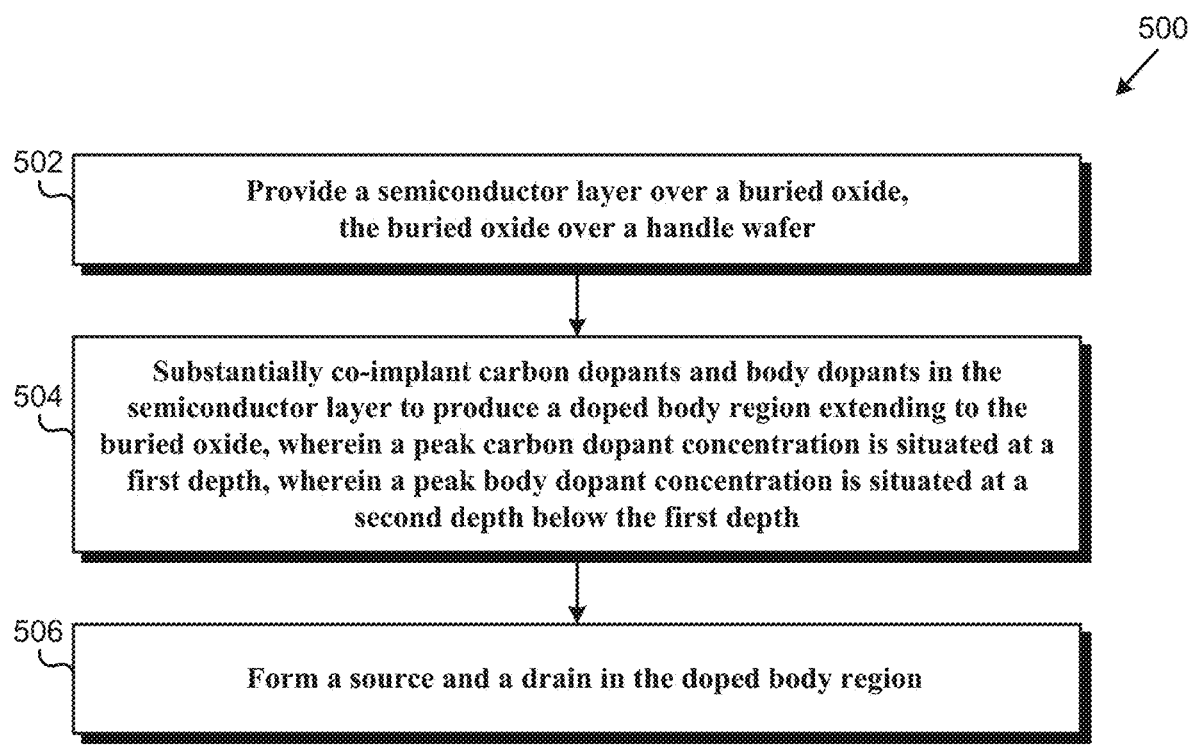
FIG. 13 illustrates a flowchart of an exemplary method for fabricating an SOI structure according to one implementation of the present application.
Figure 14:
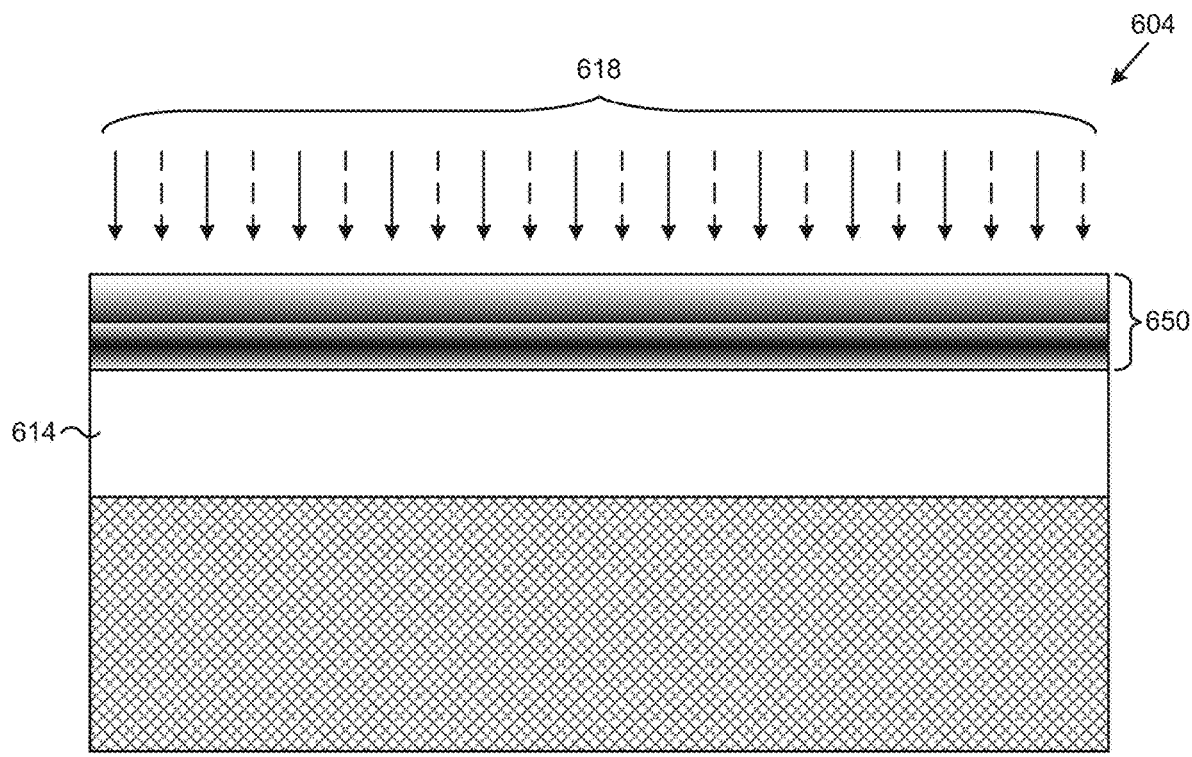
FIG. 14 illustrates an SOI structure processed in accordance with the flowchart of FIG. 13 according to one implementation of the present application.
Figure 16:
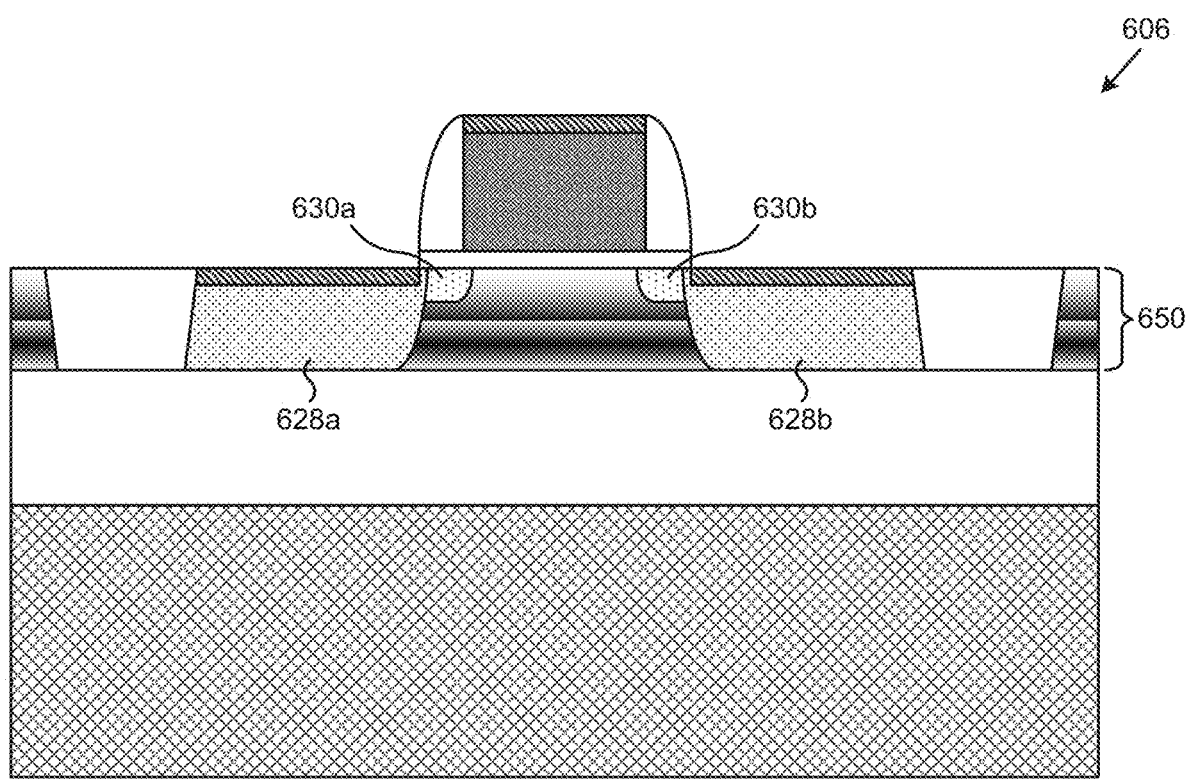
FIG. 16 illustrates an SOI structure processed in accordance with the flowchart of FIG. 13 according to one implementation of the present application.

FIG. 13 illustrates a flowchart of an exemplary method for fabricating an SOI structure according to one implementation of the present application. Structures shown in FIGS. 14 and 16 illustrate the results of performing actions 502 through 506 shown in flowchart 500 of FIG. 13. For example, FIG. 14 shows an SOI structure after performing actions 502 and 504 in FIG. 13, FIG. 16 shows an SOI structure after performing action 506 in FIG. 13.

Actions 502 through 506 shown in flowchart 500 of FIG. 13 are sufficient to describe one implementation of the present inventive concepts. Other implementations of the present inventive concepts may utilize actions different from those shown in the flowchart of FIG. 13. Certain details and features have been left out of the flowchart that are apparent to a person of ordinary skill in the art. For example, an action may consist of one or more sub-actions or may involve specialized equipment or materials, as known in the art. Moreover, some actions, such as masking and cleaning actions, are omitted so as not to distract from the illustrated actions.

Processing of an SOI structure according to the flowchart of FIG. 13 can begin with action 502 by providing an SOI structure including a handle wafer, BOX, and semiconductor layer. The provided SOI structure generally corresponds to SOI structure 202 in FIG. 2, and may have any implementations and advantages described above.

FIG. 14 illustrates an SOI structure processed in accordance with action 504 in the flowchart of FIG. 13 according to one implementation of the present application. As shown in FIG. 14, in SOI structure 604, carbon dopants and body dopants, collectively referred to as dopants 618 in the present application, are substantially co-implanted in the semiconductor layer to produce doped body region 650 extending to BOX 614. As used in the present application, "substantially co-implanting" refers to implanting carbon dopants and body dopants either concurrently or back-to-back without intermediate processing actions.

Doped body region 650 is a region of the semiconductor layer comprising both carbon dopants and body dopants 618 having the first conductivity type. In one implementation, doped body region 650 may comprise carbon dopants and boron body dopants, and may have P-type conductivity. The implantation energies and implant dosages of dopants 618 are configured such that a peak carbon dopant concentration is situated at a first depth in doped body region 650, and a peak body dopant concentration is situated at a second depth in doped body region 650 below the first depth, as described below. In one implementation, carbon dopants of dopants 618 may have an implant dosage of approximately $1.0*10^{15}/cm^3$, and may utilize an implantation energy of approximately fifteen kiloelectronvolts (25 keV), while body dopants of dopants 618 may have an implant dosage of approximately $4.0*10^{11}/cm^3$ to $1.0*10^{13}/cm^3$, and may utilize an implantation energy of approximately twelve to twenty kiloelectronvolts (12-20 keV).

In the implementation shown in FIG. 14, doped body region 650 is formed along the entire width of SOI structure 604, such that doped body region 650 is substantially coextensive with the semiconductor layer, which may simplify fabrication. In various implementations, doped body region 650 may be formed in select regions of the semiconductor layer along the width of SOI structure 604, for example, by using a mask prior ion implantation.

Figure 15:
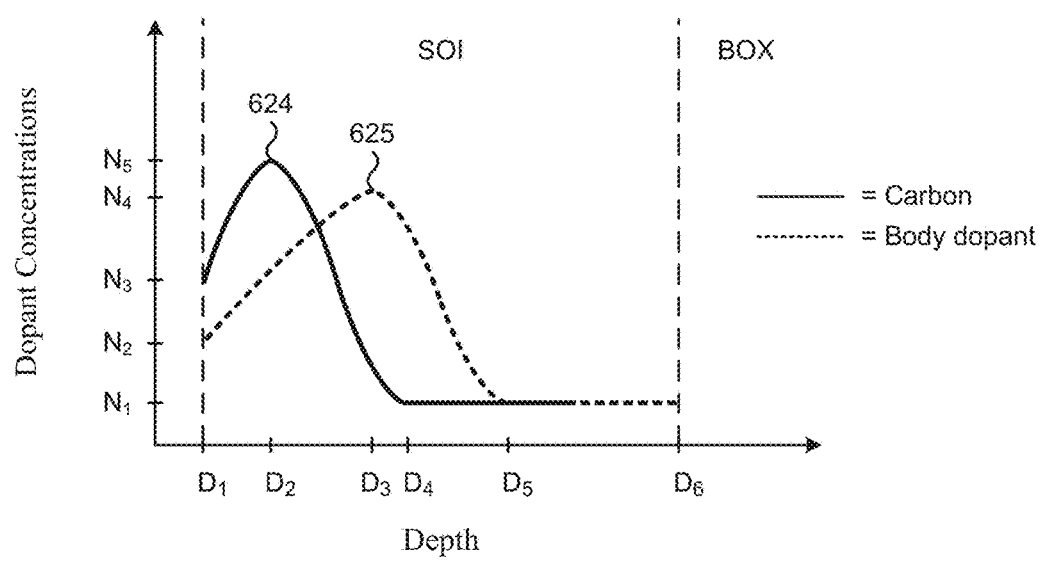
FIG. 15 illustrates an exemplary graph of dopant concentrations versus depth according to one implementation of the present application.

FIG. 15 illustrates an exemplary graph of dopant concentrations versus depth according to one implementation of the present application. In the graph, the y-axis represents the concentration of dopants in doped body region 650 in FIG. 14. The x-axis represents the depth in doped body region 650 in FIG. 14, where depth $D_1$ corresponds to a top surface of the semiconductor layer, and depth $D_6$ corresponds to a bottom surface of the semiconductor layer. Trace 624 represents the concentration of carbon dopants in doped body region 650. Trace 625 represents the concentration of body dopants having the first conductivity type, such as boron dopants, in the doped body region 650.

As shown by trace 624 in FIG. 15, carbon dopants have an initial carbon dopant concentration $N_3$ at depth $D_1$, which then rises to a peak carbon dopant concentration $N_5$ at depth $D_2$, which then falls to low carbon dopant concentration $N_1$ at approximately depth $D_4$. Concentration $N_1$ may represent a negligible or substantially zero carbon concentration. As shown by trace 625, body dopants have an initial body dopant concentration $N_2$ at depth $D_1$, which then rises to a peak body dopant concentration $N_4$ at depth $D_3$, which then falls to low body dopant concentration $N_1$ at approximately depth $D_5$.

As shown by traces 624 and 625 in FIG. 15, co-implanting carbon dopants and body dopants 618 as shown in FIG. 14 and in accordance with action 504 in the flowchart of FIG. 13, produces doped body region 650 having a peak carbon dopant concentration at a higher depth $D_2$ and having a peak body dopant concentration at a lower depth $D_3$. As a result, the carbon dopants in body region 650 effectively inhibit body dopants, such as boron, in body region 650 from diffusing upwards during fabrication of SOI structure 604 and during subsequent processing, as described above. Thus, SOI structure 604 in FIG. 14 manufactured according to the flowchart in FIG. 13 generally represents an alternative to SOI structure 208 in FIG. 5 manufactured according to the flowchart in FIG. 2 and SOI structure 408 in FIG. 11 manufactured according to the flowchart in FIG. 8.

Notably, because SOI structure 604 in FIG. 14 utilizes a carbon implant rather than a carbon epitaxy, less carbon dopants are generally concentrated near the top surface of the semiconductor layer. For example, comparing trace 624 in FIG. 15 to trace 224 in FIG. 6 or trace 424 in FIG. 12, trace 624 in FIG. 15 generally has lower carbon dopant concentration near the top surface of the semiconductor layer (i.e., near depth $D_1$). As a result, a subsequently formed gate oxide (not shown in FIG. 14) can be formed on the semiconductor layer with increased reliability. Also because SOI structure 604 utilizes a carbon implant rather than a carbon epitaxy, SOI structure 604 can more readily enable a range of transitions in carbon dopant concentration, gradual or sharp, depending on implant energy and dopant concentration. In various implementations, traces 624 and 625 may exhibit different patterns or slopes than shown in FIG. 15.

FIG. 16 illustrates an SOI structure processed in accordance with action 506 in the flowchart of FIG. 13 according to one implementation of the present application. As shown in FIG. 16, a transistor including source 628a and drain 628b is formed in doped body region 650, in order to complete SOI device 606.

In one implementation source 628a and drain 628b extend to a depth below the peak carbon dopant concentration in doped body region 650 (i.e., below depth $D_2$ in FIG. 15). In one implementation LDS 630a and LDD 630b extend to a depth above the peak carbon dopant concentration in doped body region 650 (i.e., above depth $D_2$ in FIG. 15). Notably, fabrication of SOI device 606 does not require semiconductor layer thinning or carbon epitaxy. Instead, carbon dopants are substantially co-implanted with body dopants. As described above, carbon dopants in body region 650 inhibit body dopants, such as boron, in body region 650 from diffusing upwards during fabrication of SOI device 606 and during subsequent thermal processing. Except for differences noted above, SOI device 606 in FIG. 16 may generally correspond to SOI device 210 in FIG. 7, and may have any implementations and advantages described above.

Figure 17:
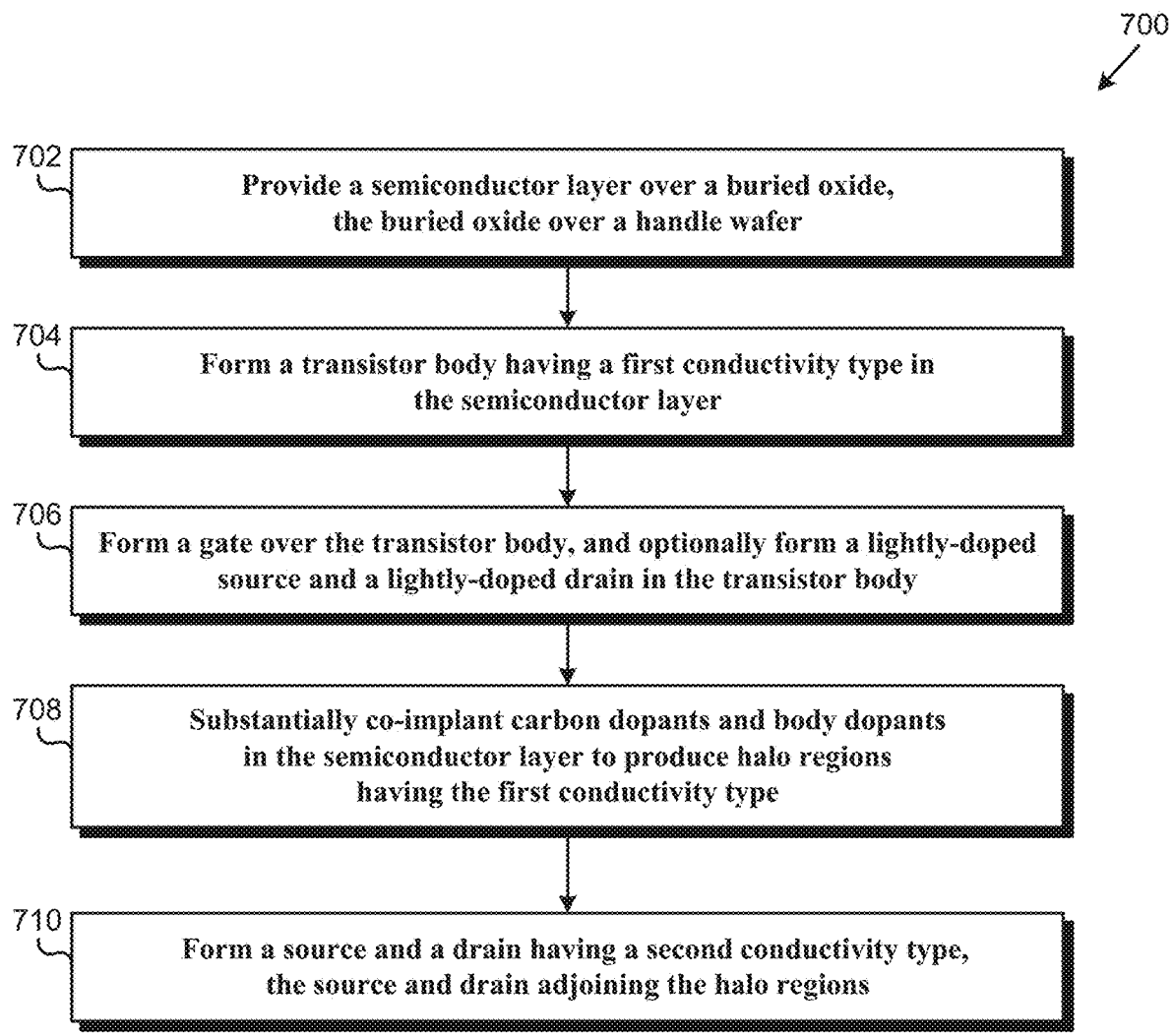
FIG. 17 illustrates a flowchart of an exemplary method for fabricating an SOI device according to one implementation of the present application.
Figure 18:
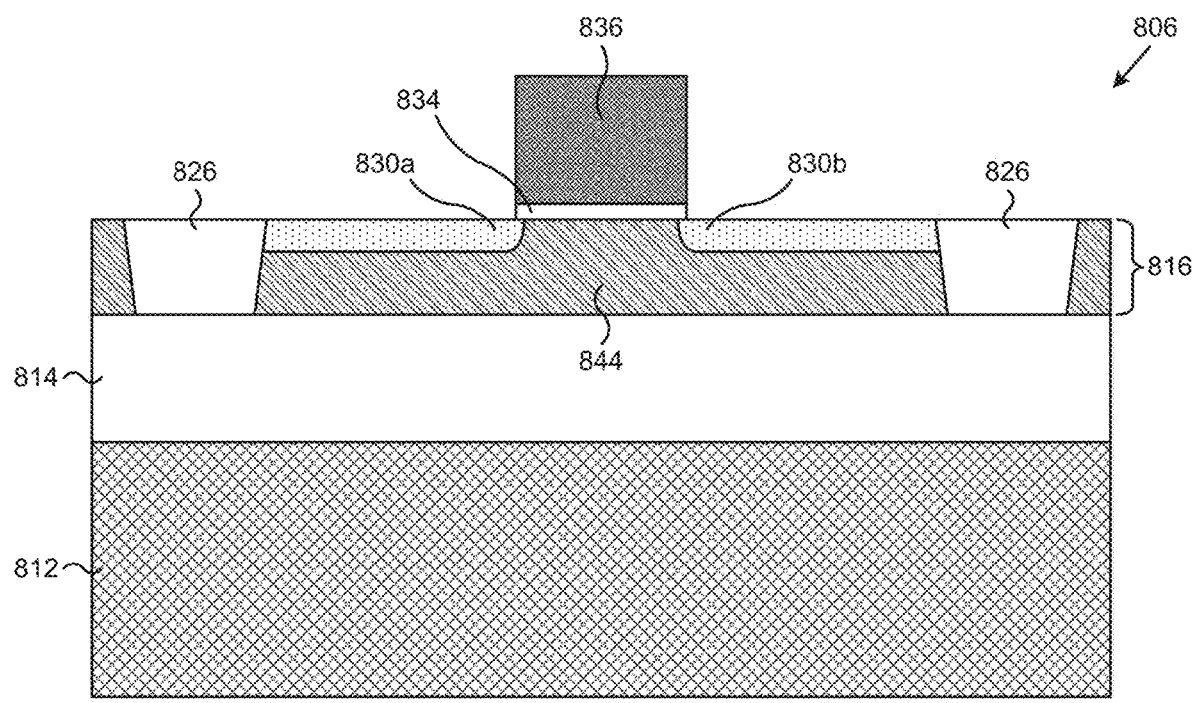
FIG. 18 illustrates an SOI structure processed in accordance with the flowchart of FIG. 17 according to one implementation of the present application.
Figure 19:
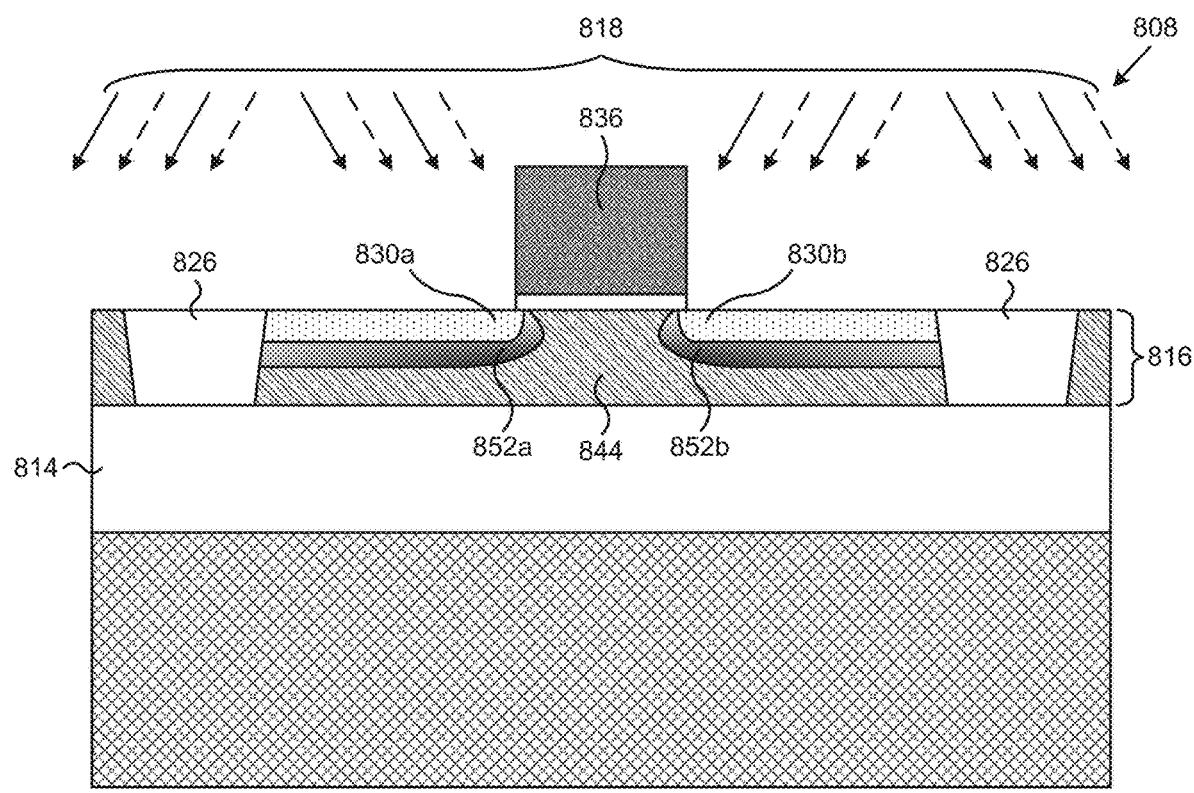
FIG. 19 illustrates an SOI structure processed in accordance with the flowchart of FIG. 17 according to one implementation of the present application.
Figure 20:
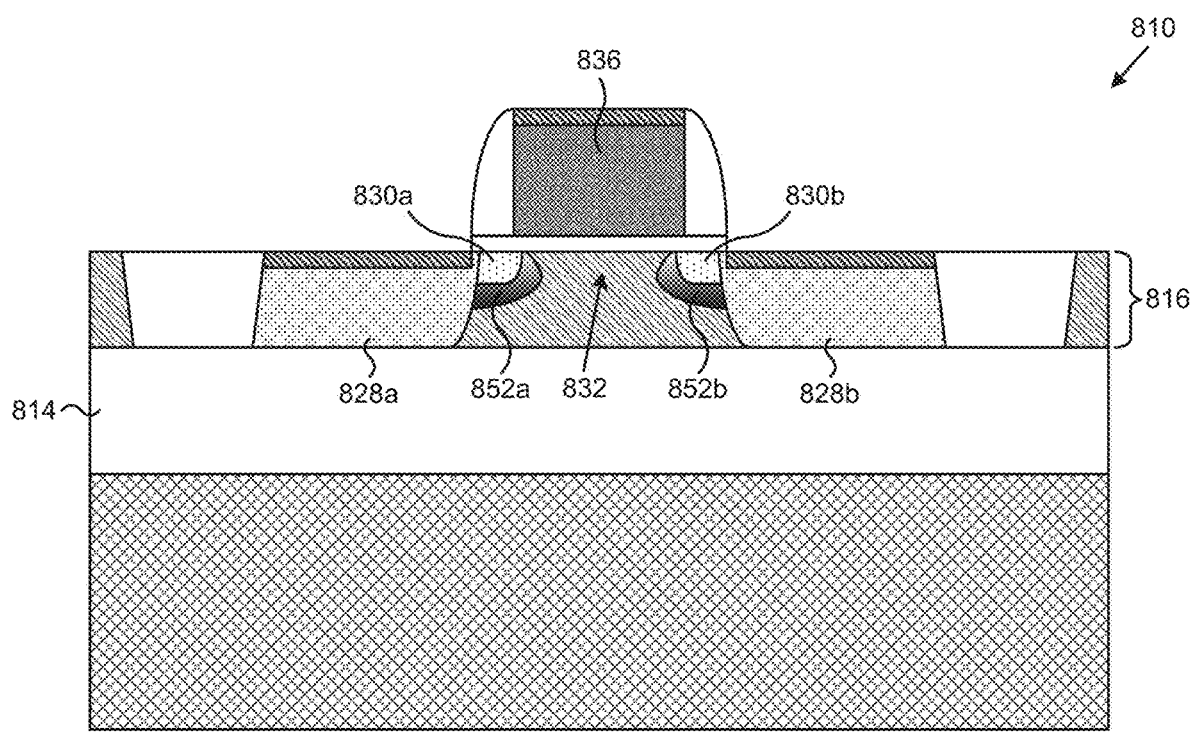
FIG. 20 illustrates an SOI device processed in accordance with the flowchart of FIG. 17 according to one implementation of the present application.

FIG. 17 illustrates a flowchart of an exemplary method for fabricating an SOI device according to one implementation of the present application. Structures shown in FIGS. 18 through 20 illustrate the results of performing actions 702 through 710 shown in flowchart 700 of FIG. 17. For example, FIG. 18 shows an SOI structure after performing actions 702, 704, and 706 in FIG. 17, FIG. 19 shows an SOI structure after performing action 708 in FIG. 17, and so forth.

Actions 702 through 710 shown in flowchart 700 of FIG. 17 are sufficient to describe one implementation of the present inventive concepts. Other implementations of the present inventive concepts may utilize actions different from those shown in the flowchart of FIG. 17. Certain details and features have been left out of the flowchart that are apparent to a person of ordinary skill in the art. For example, an action may consist of one or more sub-actions or may involve specialized equipment or materials, as known in the art. Moreover, some actions, such as masking and cleaning actions, are omitted so as not to distract from the illustrated actions.

FIG. 18 illustrates an SOI structure processed in accordance with actions 702, 704, and 706 in the flowchart of FIG. 17 according to one implementation of the present application. As shown in FIG. 18, in SOI structure 806, an SOI substrate including handle wafer 812 over BOX 814 over semiconductor layer 816 has been provided. The provided SOI substrate generally corresponds to SOI structure 202 in FIG. 2, and may have any implementations and advantages described above.

Transistor body 844 having a first conductivity type has been formed in the semiconductor layer. Transistor body 844 may be formed by ion implantation of body dopants through a top surface of semiconductor layer 816. In the implementation shown in FIG. 18, transistor body 844 is formed along the entire width of SOI structure 806, which may simplify fabrication. In various implementations, transistor body 844 may be formed in select regions along the width of SOI structure 806, for example, by using a mask prior ion implantation.

In SOI structure 806, gate 836 has been formed over transistor body 844. Gate 836 is situated between STIs 826 and has gate oxide 834 thereunder. Gate 836, STIs 826, and gate oxide 834 in FIG. 18 generally correspond to gate 236, STIs 226, and gate oxide 234 in FIG. 2, and may have any implementations and advantages described above. Also in SOI structure 806, LDS 830a and LDD 830b have been formed in transistor body 844. LDS 830a and LDD 830b have the second conductivity type and are substantially aligned with sides of gate 836. LDS 830a and LDD 830b in FIG. 18 generally correspond to LDS 230a and LDD 230b in FIG. 2, and may have any implementations and advantages described above.

FIG. 19 illustrates an SOI structure processed in accordance with action 708 in the flowchart of FIG. 17 according to one implementation of the present application. As shown in FIG. 19, in SOI structure 808, carbon dopants and body dopants, collectively referred to as dopants 818 in the present application, are substantially co-implanted in the semiconductor layer to produce halo regions 852a and 852b having the first conductivity type.

Halo regions 852a and 852b are regions of semiconductor layer 816 comprising both carbon dopants and body dopants 818 having the first conductivity type. In one implementation, halo regions 852a and 852b may comprise carbon dopants and boron body dopants, and may have P-type conductivity. In the present implementation, the implantation energies and implant dosages of dopants 818 are configured such that halo regions 852a and 852b are situated at a depth below LDS 830a and LDD 830b and above BOX 814, adjoining LDS 830a and LDD 830b. In one implementation, during formation of halo regions 852a and 852b, carbon dopants of dopants 818 may have an implant dosage of approximately $1.0*10^{15}/cm^3$, and may utilize an implantation energy of approximately fifteen kiloelectronvolts (25 keV), while body dopants of dopants 818 may have an implant dosage of approximately $4.0*10^{12}/cm^3$ to $1.0*10^{13}/cm^3$, and may utilize an implantation energy of approximately twelve to twenty kiloelectronvolts (12-20 keV). Halo regions 852a and 852b may have a higher concentration of body dopants having the first conductivity type compared to transistor body 844. Halo regions 852a and 852b may have a lower concentration of body dopants having the first conductivity type compared to the concentration of dopants in LDS 830a and LDD 830b having the second conductivity type. For example, the concentration of P-type dopants in halo regions 852a and 852b may be greater than the concentration of P-type dopants in transistor body 844, but less than the concentration of N-type dopants in LDS 830a and LDD 830b.

Forming halo regions 852a and 852b may utilize an implant angled away from the direction normal to the top surface of semiconductor layer 816. In various implementations, dopants 818 may be implanted at angle of approximately twenty to forty five degrees (20°-45°) from the direction normal to the top surface of semiconductor layer 816, or greater or less. Thus, halo regions 852a and 852b have a different profile compared to LDS 830a and LDD 830b or a subsequently formed source or drain (not shown in FIG. 19). For example, halo regions 852a and 852b may have a substantially elliptical or halo-shaped profile, rather than a substantially rectangular or rounded-rectangular profile.

In order to form halo regions 852a and 852b under both LDS 830a and LDD 830b, in one implementation, the halo implant may maintain a fixed angle while SOI structure 808 may be rotated. In another implementation, the halo implant may comprise two implants performed at angles mirrored horizontally in FIG. 19. In one implementation, forming each of halo regions 852a and 852b may utilize multiple halo implants at different angles. For example, forming each of halo regions 852a and 852b may comprise four successive halo implants at angles of twenty five degrees (25°), thirty 10 degrees (30°), thirty five degrees (35°), and forty degrees (40°). As shown in FIG. 19, halo regions 852a and 852b may be situated partially under gate 836. In one implementation, blocking masks (not shown in FIG. 19) may be situated over STIs 826 and/or portions of LDS 830a and LDD 830b, in order to form halo regions 852a and 852b localized to areas under the sides of gate 836.

FIG. 20 illustrates an SOI device processed in accordance with action 710 in the flowchart of FIG. 17 according to one implementation of the present application. As shown in FIG. 20, a transistor is formed in semiconductor layer 816 in order to complete SOI device 810, including source 828a and drain 828b having the second conductivity type and adjoining halo regions 852a and 852b.

In the implementation of FIG. 20, halo regions 852a and 852b are illustrated as extending vertically from the top surface of semiconductor layer 816 to a depth between LDS 830a or LDD 830b and source 828a or drain 828b, and extending laterally from edges of source 828a and drain 828b to a width under gate 836. In various implementations, halo regions 852a and 852b may have any other shapes or dimensions as they adjoin source 828a and drain 828b. For example, in one implementation, uppermost portions of halo regions 852a and 852b may be between the top surface of semiconductor layer 816 and bottom portions of LDS 830a and LDD 830b. In another implementation, lowermost portions of halo regions 852a and 852b may be below source 828a and drain 828b. In various implementations, source 828a and drain 828b may not extend to BOX 814, or halo regions 852a and 852b may extend to BOX 814. In yet another implementation, LDS 830a and LDD 830b may be optional.

Notably, because carbon dopants are substantially co-implanted with body dopants, halo regions 852a and 852b include both carbon dopants and body dopants. Body dopants in halo regions 852a and 852b inhibit punch-through between source and drain in short-channel devices. Meanwhile carbon dopants in halo regions 852a and 852b inhibits body dopants, such as boron, of halo regions 852a and 852b from diffusing upwards into channel region 832 and/or LDS 830a and LDD 830b during fabrication of SOI device 810 and during subsequent thermal processing, thereby reducing OFF state leakage current and other diffusion side effects. Except for differences noted above, SOI device 810 in FIG. 20 may generally correspond to SOI device 210 in FIG. 7, and may have any implementations and advantages described above.

Figure 21:
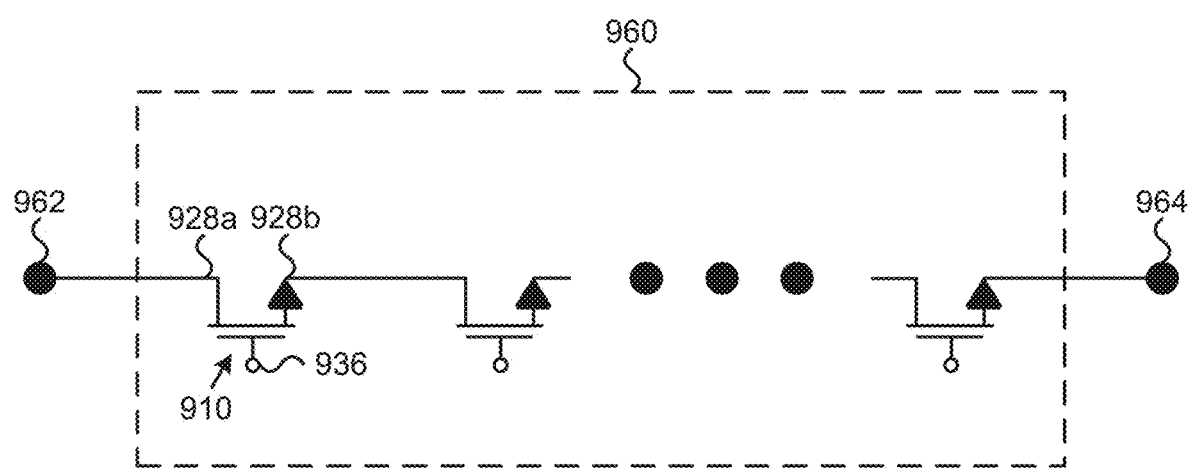
FIG. 21 illustrates a portion of a circuit including a radio frequency (RF) switch employing stacked SOI transistors according to one implementation of the present application.

FIG. 21 illustrates a portion of a circuit including a radio frequency (RF) switch employing stacked SOI transistors according to one implementation of the present application. FIG. 21 represents an exemplary use case for SOI transistors, such as SOI device 210 in FIG. 7, SOI device 606 in FIG. 16, or SOI device 810 in FIG. 20. The circuit in FIG. 21 includes RF switch 960 between first node 962 and second node 964. First node 962 and second node 964 generally represent an input and an output respectively of RF switch 960. In various implementations, first node 962 or second node 964 may correspond to an antenna, a filter, a low-noise amplifier (LNA), a power amplifier (PA), a ground, or another device.

RF switch 960 serves to pass or to block RF signals between first node 962 and second node 964, depending on whether RF switch 960 is in an ON state or an OFF state. RF switch 960 includes a stack of SOI transistors 910, which correspond to SOI transistors according to implementations of the present applications, such as SOI device 210 in FIG. 7, SOI device 606 in FIG. 16, or SOI device 810 in FIG. 20. The drain 928a of the first SOI transistor 910 is coupled to first node 962, while subsequent drains 928a are coupled to sources 928b of previous SOI transistors 910. The source 928b of the last SOI transistor 910 is coupled to second node 964. Gates 936 of SOI transistors 910 can be coupled to a controller or a pulse generator (not shown in FIG. 21) for switching SOI transistors 910 between ON and OFF states. By stacking SOI transistors 910 as shown in FIG. 21, the overall OFF state power and voltage handling capability for RF switch 960 can be increased. In various implementations, RF switch 960 may have more or fewer stacked SOI transistors 910 than shown in FIG. 21. For example, RF switch 960 may have between six and thirty stacked SOI transistors 910. In the present implementation, SOI transistors 910 are N-type field effect transistors (NFETs).

Figure 22:
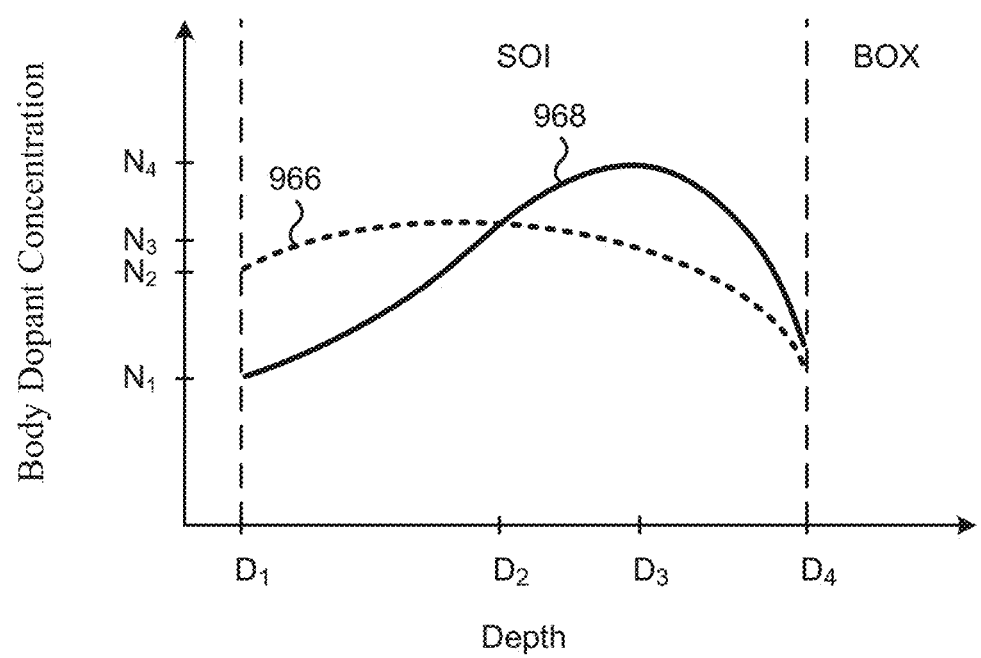
FIG. 22 illustrates an exemplary graph of dopant concentrations versus depth according to one implementation of the present application.

FIG. 22 illustrates an exemplary graph of body dopant concentration versus depth according to one implementation of the present application. In the graph, the y-axis represents the concentration of body dopants in a semiconductor layer after completion of the corresponding SOI device and any subsequent thermal processing. The x-axis represents the depth in the semiconductor layer, where depth $D_1$ corresponds to a top surface of the semiconductor layer, and depth $D_4$ corresponds to a bottom surface of the semiconductor layer. In the graph, dotted trace 966 represents the concentration of body dopants in the semiconductor layer of a conventional SOI device, while solid trace 968 represents the concentration of body dopants in the semiconductor layer of an SOI device according to the present application, such as an SOI device manufactured according to one of the flowcharts in FIGS. 1, 8, 13, and 17. Solid trace 968 may represent an exemplary vertical sample through a transistor body for an SOI device manufactured according to one of the flowcharts in FIGS. 1, 8, or 13, or an exemplary vertical sample through a halo region for an SOI device manufactured according the flowchart in FIG. 17.

As shown by dotted trace 966 in FIG. 22, body dopants have an initial body dopant concentration $N_2$ at depth $D_1$, which then rises to a peak body dopant concentration $N_3$ at depth $D_2$, which then falls to low body dopant concentration at approximately depth $D_4$. As shown by solid trace 968, body dopants have an initial body dopant concentration $N_1$ at depth $D_1$, which then rises to a peak body dopant concentration $N_4$ at depth $D_3$, which then falls to low body dopant concentration at approximately depth $D_4$.

As shown by dotted trace 966 and solid trace 968 in FIG. 22, near the top of the semiconductor layer (i.e., between depth $D_1$ and depth $D_2$), the conventional SOI device has a higher body dopant concentration than the SOI devices according to the present application, whereas near a bottom portion of the semiconductor layer (i.e., between depth $D_2$ and depth $D_4$), the SOI devices according to the present application have a higher body dopant concentration than the conventional SOI device. In one implementation, the area under each of dotted trace 966 and solid trace 968, or the total body dopants is approximately equal. The difference in shape between dotted trace 966 and solid trace 968 represents body dopants having diffused upwards in the conventional SOI device. The SOI devices according to the present application effectively inhibited such diffusion by introducing carbon dopants to body regions, as described above. Accordingly, the SOI devices according to the present application effectively inhibit detrimental side effects of such diffusion, and can also maintain a retrograde doping profile in the semiconductor layer with respect to body dopants having the first conductivity type. In various implementations, traces 966 and 968 may exhibit different patterns or slopes than shown in FIG. 22.

SOI structures according to the present invention, such as SOI device 210 in FIG. 7, SOI structure 408 in FIG. 11, SOI device 606 in FIG. 6, and SOI device 810 in FIG. 20, result in numerous advantages, some of which are stated below. First, because carbon dopants inhibit body dopants, such as boron, from diffusing upwards during fabrication of SOI devices and during subsequent thermal processing, SOI structures according to the present invention maintain a higher concentration of body dopants lower in the semiconductor layer. This advantageously inhibits short-channel effects that would otherwise occur, such as punch-through between the source and the drain, especially where the higher concentration of body dopants extends to the critical interface of the semiconductor layer with the BOX.

Second, SOI devices according to the present invention experience lesser gate induced drain leakage (GIDL) current in an OFF state compared to typical SOI devices. Accordingly, an RF switch such as RF switch 960 in FIG. 21 employing SOI transistor 910 will experience overall higher power handling in an OFF state. Where RF switch 960 requires high OFF state power handling capability and employs numerous stacked SOI transistors, the advantages of the higher OFF state power handling capability of SOI transistor 910 are compounded.

Third, SOI structures according to the present invention enable a variety of dopant profiles, including a retrograde body doping profile, in the semiconductor layer. As a result, as described above, SOI devices benefit from a significantly lower $R_{ON}$ through the channel region, the LDS, the LDDs, the source silicide, and the drain silicide. Moreover, SOI devices benefit from a significantly lower product of ON-state resistance and OFF-state capacitance ($R_{ON} \times C_{OFF}$), without trading off breakdown voltage handling capability.

Fourth, SOI structures according to the present invention significantly reduce the short-channel effect of threshold voltage roll-off. Accordingly, device dimensions such as channel length and gate length can be scaled down with fewer performance trade-offs.

Fifth, SOI structures according to the present invention can be formed from typical pre-fabricated SOI substrates, such as SOI structure 202 shown in FIG. 2. Accordingly, SOI structures according to the present invention are suitable for large scale production without premium costs associated with specialty substrates.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A semiconductor-on-insulator (SOI) structure comprising:
   a semiconductor layer over a buried oxide, said buried oxide over a handle wafer;
   a carbon-doped epitaxial layer of said semiconductor layer,
   a doped body region in said semiconductor layer under said carbon-doped epitaxial layer, said doped body region extending to said buried oxide, wherein said carbon-doped epitaxial layer and said doped body region have a same conductivity type;
   a source or a drain, wherein said source or said drain and said doped body region have different conductivity types.

2. The SOI structure of claim 1, wherein said source or said drain is in said doped body region under said carbon-doped epitaxial layer.

3. A semiconductor-on-insulator (SOI) structure comprising:
   a semiconductor layer over a buried oxide, said buried oxide over a handle wafer;
   a doped body region in said semiconductor layer and extending to said buried oxide, said doped body region including carbon dopants and body dopants;
   wherein a peak carbon dopant concentration is situated at a first depth;
   wherein a peak body dopant concentration is situated at a second depth below said first depth.

4. The SOI structure of claim 3, further comprising a source and a drain in said doped body region below said first depth.

5. The SOI structure of claim 1, wherein said body dopants have P-type conductivity.

6. The SOI structure of claim 5, wherein said dopants having P-type conductivity comprise boron.

7. The SOI structure of claim 5, wherein said dopants having P-type conductivity are formed using difluoride ($BF_2$) with an implantation energy of approximately fifteen kiloelectronvolts (15 keV).

8. The SOI structure of claim 2, wherein said source or said drain comprise N-type dopants.

9. The SOI structure of claim 3, wherein said body dopants have P-type conductivity.

10. The SOI structure of claim 9, wherein said dopants having P-type conductivity comprise boron.

11. The SOI structure of claim 9, wherein said dopants having P-type conductivity are formed using difluoride ($BF_2$) with an implantation energy of approximately fifteen kiloelectronvolts (15 keV).

12. The SOI structure of claim 4, wherein said source and a drain comprise N-type dopants.

* * * * *